United States Patent
Park et al.

(10) Patent No.: US 9,685,237 B2
(45) Date of Patent: Jun. 20, 2017

(54) DRIVER CIRCUIT CHARGING CHARGE NODE

(71) Applicant: Samsung Electronics Co., Ltd., Suwon-si, Gyeonggi-do (KR)

(72) Inventors: Hyunkook Park, Anyang-si (KR); Yeongtaek Lee, Seoul (KR); Daeseok Byeon, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/189,136

(22) Filed: Jun. 22, 2016

(65) Prior Publication Data

US 2017/0110197 A1   Apr. 20, 2017

(30) Foreign Application Priority Data

Oct. 16, 2015   (KR) .......................... 10-2015-0144844

(51) Int. Cl.
| | |
|---|---|
| *G11C 7/12* | (2006.01) |
| *G11C 8/08* | (2006.01) |
| *G11C 5/06* | (2006.01) |
| *G11C 16/28* | (2006.01) |
| *H03K 5/08* | (2006.01) |
| *H03K 5/24* | (2006.01) |

(Continued)

(52) U.S. Cl.
CPC .......... *G11C 16/28* (2013.01); *G11C 16/0483* (2013.01); *G11C 16/08* (2013.01); *G11C 16/10* (2013.01); *G11C 16/16* (2013.01); *H03K 5/08* (2013.01); *H03K 5/24* (2013.01); *G11C 5/147* (2013.01); *G11C 7/067* (2013.01); *G11C 7/12* (2013.01); *G11C 13/004* (2013.01); *G11C 2013/0054* (2013.01)

(58) Field of Classification Search
CPC . G11C 7/12; G11C 13/004; G11C 2013/0054; G11C 5/047; G11C 7/067
USPC ....... 365/189.06, 189.09, 189.07, 63, 185.23
See application file for complete search history.

(56) References Cited

U.S. PATENT DOCUMENTS

| | | | |
|---|---|---|---|
| 4,761,765 A * | 8/1988 | Hashimoto | ............ G11C 7/062 365/185.21 |
| 6,490,199 B2 | 12/2002 | Lee et al. | |

(Continued)

FOREIGN PATENT DOCUMENTS

| | | |
|---|---|---|
| JP | 2005/190626 A | 7/2005 |
| KR | 2010/0040424 A | 4/2010 |
| KR | 2010/0050872 A | 5/2010 |
| KR | 2010/0097891 A | 9/2010 |

*Primary Examiner* — Ly D Pham
(74) *Attorney, Agent, or Firm* — Harness, Dickey & Pierce, P.L.C.

(57) ABSTRACT

Disclosed is a driver circuit. The driver circuit includes a clamp transistor, a comparison voltage transistor, an amplification transistor, a bias transistor, and a charge circuit. The comparison voltage is configured to provide a comparison voltage. The amplification transistor includes an amplification gate connected to a first node of the clamp transistor, a first amplification node configured to receive the comparison voltage, and a second amplification node connected to a gate of the clamp transistor. The bias transistor is configured to supply a bias voltage. The charge circuit is at least one of configured to drain a current from the first node through the clamp transistor and configured to supply a current to the first node through the clamp transistor.

10 Claims, 18 Drawing Sheets

(51) Int. Cl.
*G11C 16/08* (2006.01)
*G11C 16/04* (2006.01)
*G11C 16/10* (2006.01)
*G11C 16/16* (2006.01)
G11C 13/00 (2006.01)
G11C 7/06 (2006.01)
G11C 5/14 (2006.01)

(56) References Cited

U.S. PATENT DOCUMENTS

| | | | |
|---|---|---|---|
| 6,999,345 B1 * | 2/2006 | Park | G11C 16/3459 |
| | | | 365/185.18 |
| 7,027,341 B2 | 4/2006 | Morikawa | |
| 7,082,069 B2 | 7/2006 | Chou et al. | |
| 7,447,089 B2 | 11/2008 | Im et al. | |
| 7,679,133 B2 | 3/2010 | Son et al. | |
| 8,243,530 B2 | 8/2012 | Kang et al. | |
| 8,553,466 B2 | 10/2013 | Han et al. | |
| 8,559,235 B2 | 10/2013 | Yoon et al. | |
| 8,654,587 B2 | 2/2014 | Yoon et al. | |
| 2005/0036395 A1 * | 2/2005 | Maejima | G11C 16/0483 |
| | | | 365/232 |
| 2009/0201747 A1 | 8/2009 | Hsu et al. | |
| 2011/0233648 A1 | 9/2011 | Seol et al. | |
| 2014/0078820 A1 | 3/2014 | Li et al. | |
| 2014/0104925 A1 * | 4/2014 | Azuma | G11C 13/004 |
| | | | 365/148 |
| 2015/0055418 A1 | 2/2015 | Murakami et al. | |

* cited by examiner

DRIVER CIRCUIT CHARGING CHARGE NODE

CROSS-REFERENCE TO RELATED APPLICATIONS

A claim for priority under 35 U.S.C. §119 is made to Korean Patent Application No. 10-2015-0144844 filed Oct. 16, 2015, in the Korean Intellectual Property Office, the entire contents of which are hereby incorporated by reference.

BACKGROUND

Example embodiments of inventive concepts described herein relate to a semiconductor circuit, and in more detail, to a driver circuit charging a charge node.

A memory device includes a plurality of memory cells. A plurality of memory cells is regularly disposed according to a specific pattern to reduce an area occupied by the memory cells. The memory cells disposed according to a regular pattern may be connected to conductive lines for accessing the memory cells.

The memory device is highly integrated as the number of memory cells connected to each conductive line increases and a distance between conductive lines becomes shorter. In this case, a resistive load and a capacitive load of each conductive line increase. When the resistive load and the capacitive load increase, a lot of time is required to drive a voltage of a conductive line to a target level, and thus an operating speed of the memory device may decrease. Accordingly, there are required a device and a method capable of driving each conductive line with a target voltage quickly even though the resistive load and capacitive load of each conductive line increase.

SUMMARY

Example embodiments of inventive concepts provide a driver circuit capable of reducing an occupied area and improving a driving speed.

According to example embodiments of inventive concepts, a driver circuit includes a clamp transistor, an amplification transistor, a bias transistor, and a charge circuit. The clamp transistor includes a clamp gate, a first clamp node, and a second clamp node connected to a charge node. The comparison voltage transistor includes a comparison voltage gate configured to receive a reference voltage, a first comparison voltage node configured to receive a first voltage, and a second comparison voltage node configured to output a comparison voltage. The amplification transistor includes an amplification gate connected to the charge node, a first amplification node connected to the second comparison voltage node of the comparison voltage transistor and configured to receive the comparison voltage, and a second amplification node connected to the clamp gate of the clamp transistor. The bias transistor includes a bias gate configured to receive a bias voltage, a first bias node connected to the clamp gate of the clamp transistor, and a second bias node configured to receive a second voltage. The charge circuit is one of configured to drain a current from the charge node through the clamp transistor and configured to supply a current to the charge node through the clamp transistor.

In example embodiments, the clamp transistor and the amplification transistor may be PMOS transistors, and the comparison voltage transistor and the bias transistor may be NMOS transistors.

In example embodiments, the first voltage may be a power supply voltage, and the second voltage may be a ground voltage.

In example embodiments, the clamp transistor and the amplification transistor may be NMOS transistors, and the comparison voltage transistor and the bias transistor may be PMOS type transistors.

In example embodiments, the first voltage may be a ground voltage, and the second voltage may be a power supply voltage.

In example embodiments, the driver circuit may further include an enable transistor connected between the clamp gate of the clamp transistor and the second amplification node of the amplification transistor, and the enable transistor may be configured to receive an enable signal and to be activated or inactivated based on the enable signal.

In example embodiments, the driver circuit may further include a voltage generator configured to supply a third voltage to the second clamp node of the clamp transistor.

In example embodiments, the amplification transistor may be configured to adjust a voltage of the clamp gate such that a voltage of the charge node reaches a target voltage.

In example embodiments, the reference voltage may be based on the target voltage of the charge node, a threshold voltage of the comparison voltage transistor, and a threshold voltage of the amplification transistor.

In example embodiments, the charge node may be connected to one of a word line and a bit line connected to memory cells.

According to example embodiments of inventive concepts, a driver circuit includes a clamp switch, a charge circuit, a comparison voltage generator, a single stage amplifier, and a current bias circuit. The clamp switch includes a gate configured to receive a clamp voltage, a first node, and a second node connected to a charge node. The charge circuit is connected to the first node of the clamp switch. The charge circuit is at least one of configured to drain a current from the charge node through the clamp switch and configured to supply a current to the charge node through the clamp switch. The comparison voltage generator is configured to output a comparison voltage. The single stage amplifier is configured to amplify a difference between the comparison voltage and a voltage of the charge node. The single stage amplifier is configured to output the clamp voltage as the amplification result. The current bias circuit is connected to the gate of the clamp switch. The current bias circuit is configured to adjust the amount of current flowing to a ground node to which a ground voltage is supplied through the comparison voltage generator, the single stage amplifier, and the bias circuit.

In example embodiments, the single stage amplifier may include a transistor including a gate connected to the charge node, a first node connected to the comparison voltage generator, and a second node connected to the gate of the clamp switch.

In example embodiments, the charge circuit may include a first transistor connected between the first node of the clamp switch and a first voltage node to which a first voltage is supplied, a second transistor connected to the first voltage node, and a current source connected between the second transistor and the first node of the clamp switch. The first transistor is configured to activate in response to a discharge enable signal. The second transistor may be configured to activate in response to a charge enable signal.

In example embodiments, the comparison voltage generator may include a transistor including a gate configured to receive a reference voltage, a first comparison voltage node configured to receive a first voltage, and a second comparison voltage node configured to output the comparison voltage.

In example embodiments, the bias circuit may include a transistor having a gate configured to receive a bias voltage, a first bias node configured to receive a first voltage, and a second bias node connected to the gate of the clamp switch.

In example embodiments, the driver circuit may be further include a voltage generator configured to supply a setting voltage to the charge node in response to a set enable signal.

In example embodiments, the driver circuit may be further include a second clamp switch including a second gate configured to receive a second clamp voltage and a third node and a fourth node connected to the charge node, a second charge circuit connected to the third node of the second clamp switch, a second comparison voltage generator configured to output a second comparison voltage, a second single stage amplifier, and a second current bias circuit connected to the second gate of the second clamp switch. The second charge circuit may be at least one of configured to drain a current from the charge node through the second clamp switch and configured to supply a current to the charge node through the second clamp switch. The second single stage amplifier may be configured to amplify a difference between the second comparison voltage and the voltage of the charge node. The second single stage amplifier may be configured to output the second clamp voltage as the amplification result. The second current bias circuit may be configured to adjust the amount of current flowing to a second ground node to which the ground voltage is supplied through the second comparison voltage generator, the second single stage amplifier, and the second current bias circuit.

In example embodiments, each of the clamp switch and the single stage amplifier includes may include a PMOS transistor, and each of the charge circuit and the bias circuit may include an NMOS transistor.

In example embodiments, each of the clamp switch and the single stage amplifier includes may include a NMOS transistor, and each of the charge circuit and the bias circuit may include an PMOS transistor.

According to example embodiments of inventive concepts, a driver circuit configured to charge a conductive line connected to a plurality of memory cells of a nonvolatile memory is provided. The driver circuit includes a clamp switch, a comparison voltage generator, a single stage amplifier, and a current bias circuit. The clamp switch includes a gate configured to receive a clamp voltage, a first node, and a second node connected to a charge node of the conductive line. The charge circuit is connected to the first node of the clamp switch and is at least one of configured to drain a current from the charge node through the clamp switch and configured to supply a current to the charge node through the clamp switch. The comparison voltage generator is configured to output a comparison voltage. The single stage amplifier is configured to amplify a difference between the comparison voltage and a voltage of the charge node. The single stage amplifier is configured to output the clamp voltage as the amplification result. The current bias circuit is connected to the gate of the clamp switch and configured to adjust the amount of current flowing to a ground node to which a ground voltage is supplied through the comparison voltage generator, the single stage amplifier, and the bias circuit.

According to example embodiments, a driver circuit includes a clamp switch, a charge circuit, and a charge control circuit. The clamp switch includes a clamp gate configured to receive a clamp voltage, a first clamp node, and a second clamp node connected to a charge node. The charge circuit includes a charge circuit node connected to the first clamp node of the clamp switch. The charge circuit node may be connected to a set transistor and a discharge transistor. The charge control circuit includes an amplifier, a bias circuit, and an enable switch serially connected to each other. The amplifier includes a first amplifier node configured to receive a comparison voltage, an amplifier gate connected to the charge node, and a second amplifier node. The enable switch includes an enable gate configured to receive an enable signal for activating or deactivating the enable switch, a first enable node connected to the second amplifier node, and a second enable node connected to the bias circuit and the clamp gate. The bias circuit includes a first bias node connected to the gate of the clamp switch and a second bias node.

In example embodiments, each of the clamp switch and the amplifier includes may include a PMOS transistor, and each of the charge circuit and the bias circuit may include an NMOS transistor.

In example embodiments, each of the clamp switch and the amplifier includes may include a NMOS transistor, and each of the charge circuit and the bias circuit may include an PMOS transistor.

In example embodiments, the charge control circuit may include a comparison voltage generator. The comparison voltage generator may include a first comparison node connected to a first voltage node, a comparison gate configured to receive a reference voltage, and a second comparison node configured to output the comparison voltage to the first amplifier node. The second bias node may be connected to a second voltage node. The first voltage may one of a power supply voltage and a ground voltage. The second voltage may be a different one of the power supply voltage and the ground voltage.

In example embodiments, the driver circuit may further include a bit line connected to the charge node. The driver circuit may be a pre-charge circuit of a memory device.

BRIEF DESCRIPTION OF THE FIGURES

The above and other features of inventive concepts will become apparent from the following description with reference to non-limiting embodiments, as shown in the following figures, wherein like reference numerals refer to like parts throughout the various figures unless otherwise specified. The drawings are not necessarily to scale, emphasis instead being placed upon illustrating principles of inventive concepts. In the drawings.

DETAILED DESCRIPTION

Figure 1:
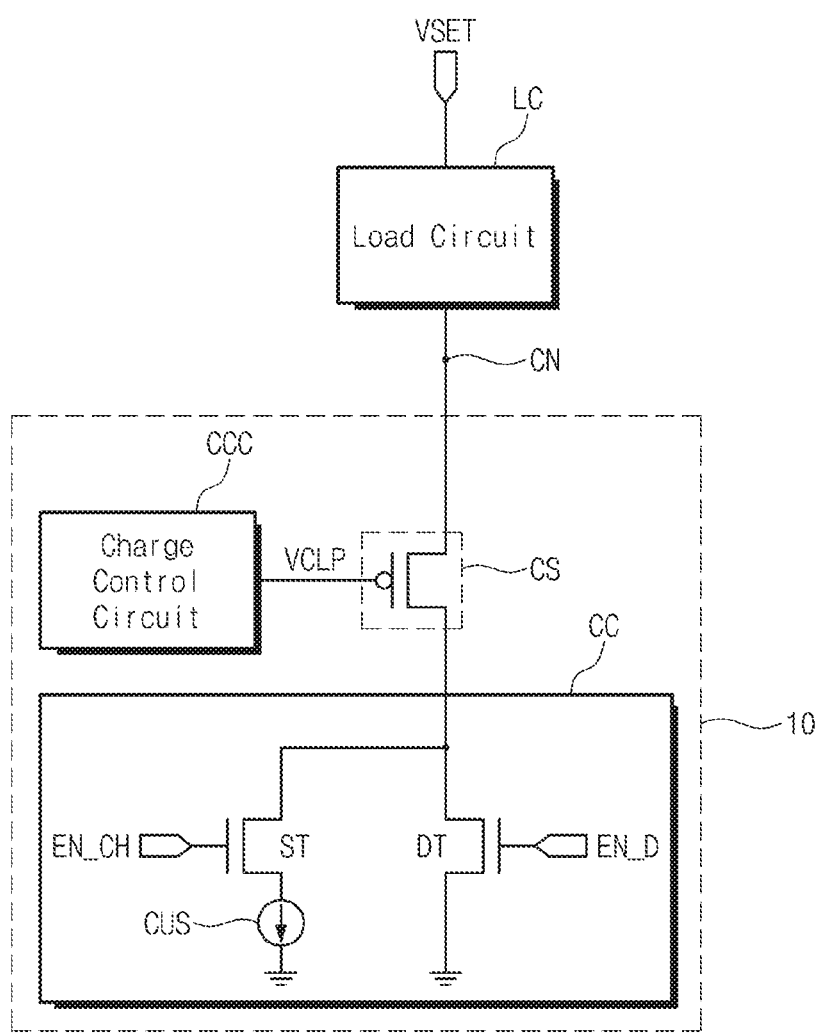
FIG. 1 is a block diagram illustrating a driver circuit according to example embodiments of inventive concepts.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference characters and/or numerals in the drawings denote like elements, and thus their description may not be repeated.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1 is a block diagram illustrating a driver circuit 10 according to example embodiments of inventive concepts. Referring to FIG. 1, a setting voltage VSET may be supplied to one end of a load circuit LC. The setting voltage VSET may be a target voltage to be charged to internal conductive paths of the load circuit LC. The driver circuit 10 may be connected with the load circuit LC through a conductive line including the charge node CN. The conductive line including the charge node CN may be electrically connected to the internal conductive paths of the load circuit LC to be charged with the setting voltage VSET. The driver circuit 10 may permit a current to flow between a source of the setting voltage VSET and the charge node CN through the internal conductive paths of the load circuit LC. For example, the driver circuit 10 may drain a current from the charge node CN or may supply a current to the charge node CN. The load circuit LC may permit a current to flow through the internal conductive paths of the load circuit LC, thereby improving a speed by which voltages of the internal conductive paths of the load circuit LC follow the setting voltage VSET.

Referring to FIG. 1, the driver circuit 10 may include a clamp switch CS, a charge control circuit CCC, and a charge circuit CC.

The clamp switch CS may adjust the amount of current that the charge circuit CC supplies to the charge node CN or the amount of current that the charge circuit CC drains from the charge node CN, under control of the charge control circuit CCC. For example, the clamp switch CS may include (or may be composed of) a transistor which has a gate configured to receive a clamp voltage VCLP from the charge control circuit CCC, a first node connected with the charge circuit CC, and a second node connected with the charge node CN. For example, the clamp switch CS may include (or may be composed of) a PMOS type transistor.

The charge control circuit CCC may adjust the clamp voltage VCLP, to make it possible to adjust the amount of current drained (or discharged) from the charge node CN or the load circuit LC through the clamp switch CS or the amount of current supplied (or flowing) to the charge node CN or the load circuit LC.

The charge circuit CC may include a discharge transistor DT, a set transistor ST, and a current source CUS. The discharge transistor DT may be connected between the clamp switch CS and a ground node to which a ground voltage is supplied. The discharge transistor DT may operate in response to a discharge enable signal EN_D. The discharge enable signal EN_D may be activated to discharge the internal conductive paths of the load circuit LC or the charge node CN. When the discharge enable signal EN_D is activated, the discharge transistor DT may be turned on, and thus the internal conductive paths of the load circuit LC or the charge node CN may be connected with the ground node.

The set transistor ST and the current source CUS may be connected in series between the clamp switch CS and the ground node. The set transistor ST may operate in response to a charge enable signal EN_CH. When the charge enable signal EN_CH is activated, the set transistor ST may be turned on, and thus the internal conductive paths of the load circuit LC or the charge node CN may be connected with the current source. In FIG. 1, an example according to example embodiments of inventive concepts is provided as the set transistor ST is disposed at a clamp switch (CS) side and the current source is disposed at a ground node side. However, the scope and spirit of inventive concepts may not be limited thereto. For example, positions of the set transistor ST and the current source CUS may be changed.

In FIG. 1, an example according to example embodiments of inventive concepts is provided as the discharge transistor DT is connected with the ground node. However, the scope and spirit of inventive concepts may not be limited thereto. For example, the discharge transistor DT may be connected with a voltage node, not the ground node. For example, the discharge transistor DT may be connected to a power node to which a power supply voltage is supplied.

As described above, the driver circuit 10 according to example embodiments of inventive concepts may drain a current from the internal conductive paths of the load circuit LC or the charge node CN or may supply a current thereto, thereby improving a speed by which voltages of the internal conductive paths of the load circuit LC or a voltage of the charge node CN follows the setting voltage VSET.

Figure 2:
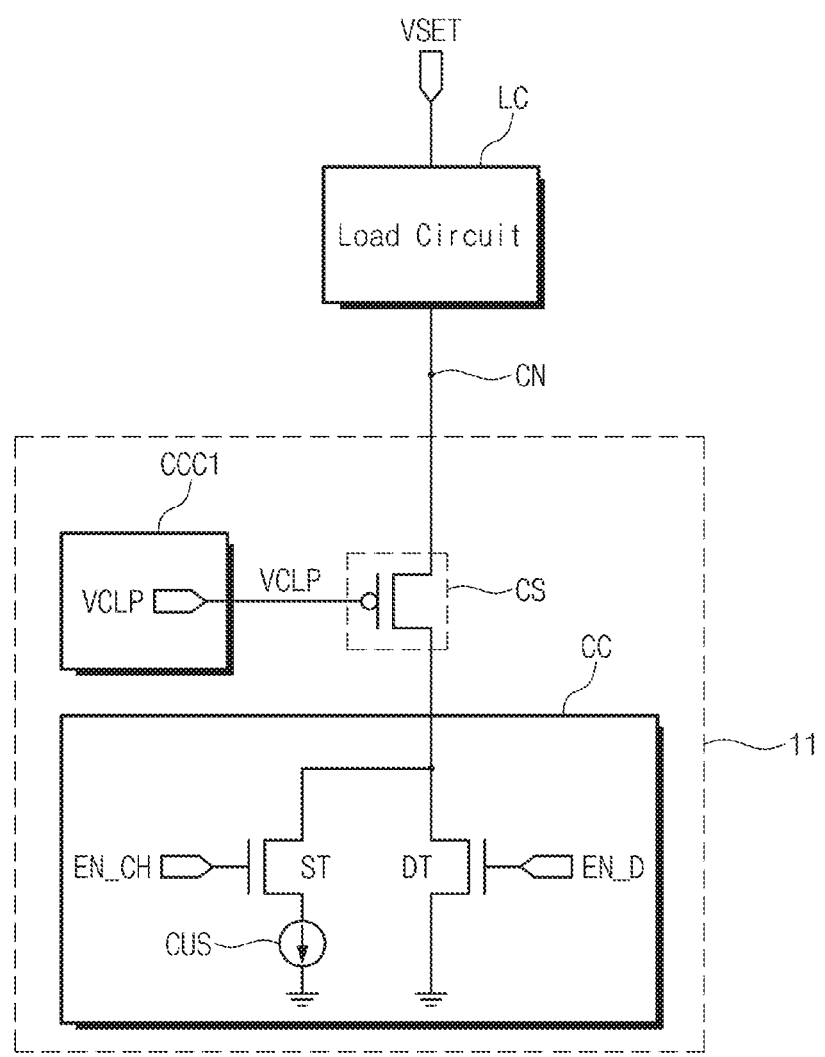
FIG. 2 is a block diagram illustrating an application of a driver circuit according to example embodiments of inventive concepts.

An example in that the clamp switch CS includes (or is be composed of) a PMOS type transistor is described with reference to FIG. 1. However, the scope and spirit of inventive concepts may be applied to the case that the clamp switch CS includes (or is be composed of) an NMOS type transistor FIG. 2 is a block diagram illustrating an application of a driver circuit 11 according to example embodiments of inventive concepts. Compared with FIG. 1, a charge control circuit CCC1 of a driver circuit 11 is illustrated in more detail in FIG. 2. Referring to FIG. 2, the charge control circuit CCC1 may be connected to a voltage source which outputs a clamp voltage VCMP having a fixed active level and a fixed inactive level. For example, when the charge enable signal EN_CH is activated, the charge control circuit CCC1 may output a voltage, which has a fixed level enough to turn on the clamp switch CS, as the clamp voltage VCLP. When the charge enable signal EN_CH is inactivated, the charge control circuit CCC1 may output a voltage, which has a fixed level enough to turn off the clamp switch CS, as the clamp voltage VCLP.

In the driver circuit 11 illustrated in FIG. 2, the clamp voltage VCLP may have a fixed level when charging the internal conductive paths of the load circuit LC or the charge node CN. As voltages of the internal conductive paths of the load circuit LC or a voltage of the charge node CN approximates to the setting voltage VSET, the driving capacity of the driver circuit 11, that is, the amount of current supplied or drained may be reduced. For this reason, a lot of time may be required to charge the internal conductive paths of the load circuit LC or the charge node CN up to the setting voltage VSET.

Figure 3:
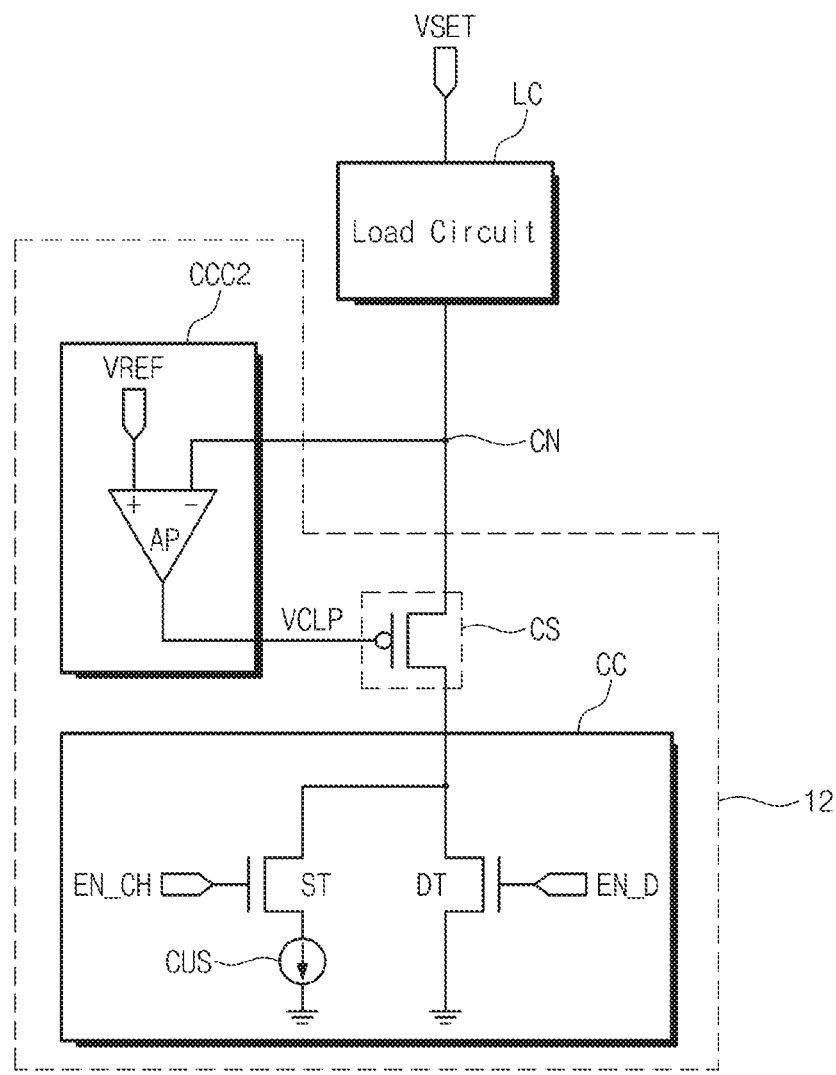
FIG. 3 is a block diagram illustrating an application of a driver circuit according to example embodiments of inventive concepts.

FIG. 3 is a block diagram illustrating an application of a driver circuit 12 according to example embodiments of inventive concepts. Compare with FIG. 1, a charge control circuit CCC2 of a driver circuit 12 is in more detail illustrated in FIG. 3. Referring to FIG. 3, a charge control circuit CCC2 may include an amplifier AP. A reference voltage VREF may be supplied to a positive input of the amplifier AP. A charge node CN may be connected to a negative input of the amplifier AP. An output of the amplifier AP may be transferred to a gate of the clamp switch CS as the clamp voltage VCLP.

At an initial state in which a charge starts, a voltage of the charge node CN or voltages of the internal conductive paths of the load circuit LC may be higher than the reference voltage VREF. The amplifier AP may apply the clamp voltage VCLP with a negative level to a gate of the clamp switch CS. If a voltage of the charge node CN or voltages of internal conductive paths of the load circuit LC is higher than the reference voltage VREF, the amplifier AP may apply the clamp voltage VCLP with an amplified negative level to a gate of the clamp switch CS, and thus the clamp switch CS may permit the greater amount of current to flow through the internal conductive paths of the load circuit LC and the charge node CN.

A difference between voltages of the internal conductive paths of the load circuit LC and the reference voltage VREF or between a voltage of the charge node CN and the reference voltage VREF may be amplified according to a gain of the amplifier AP, and the amplification result may be applied to the clamp voltage VCLP. Thus, the amount of current passing through the clamp switch CS may be amplified by the gain of the amplifier AP, thereby improving a driving capacity of the driver circuit 12.

When voltages of the internal conductive paths of the load circuit LC or a voltage of the charge node CN decreases and reaches the reference voltage VREF, the amplifier AP may transfer a ground or a positive output to the clamp switch CS, and thus the clamp switch CS may be turned on.

As described above, when the charge control circuit CCC2 includes the amplifier AP, the amount of current passing through the clamp switch CS may be amplified by the gain of the amplifier AP. This may mean that a driving capacity of the driver circuit 12 is improved. In addition, when the amplifier AP constitutes together with the charge node CN and the clamp switch CS, a voltage of the charge node CN may be adjusted by the amplifier AP to a level of the reference voltage VREF. That is, when a level of the reference voltage VREF is set to be the same as or similar to that of the setting voltage VSET, the driver circuit 12 may allow voltages of the internal conductive paths of the load circuit LC or a voltage of the charge node CN to follow a level the same as or similar to a level of the setting voltage VSET.

However, as illustrated in FIG. 3, when the charge control circuit CCC2 includes the amplifier AP, the complexity, current consumption, and an area of the charge control circuit CCC2 may increase.

Figure 4:
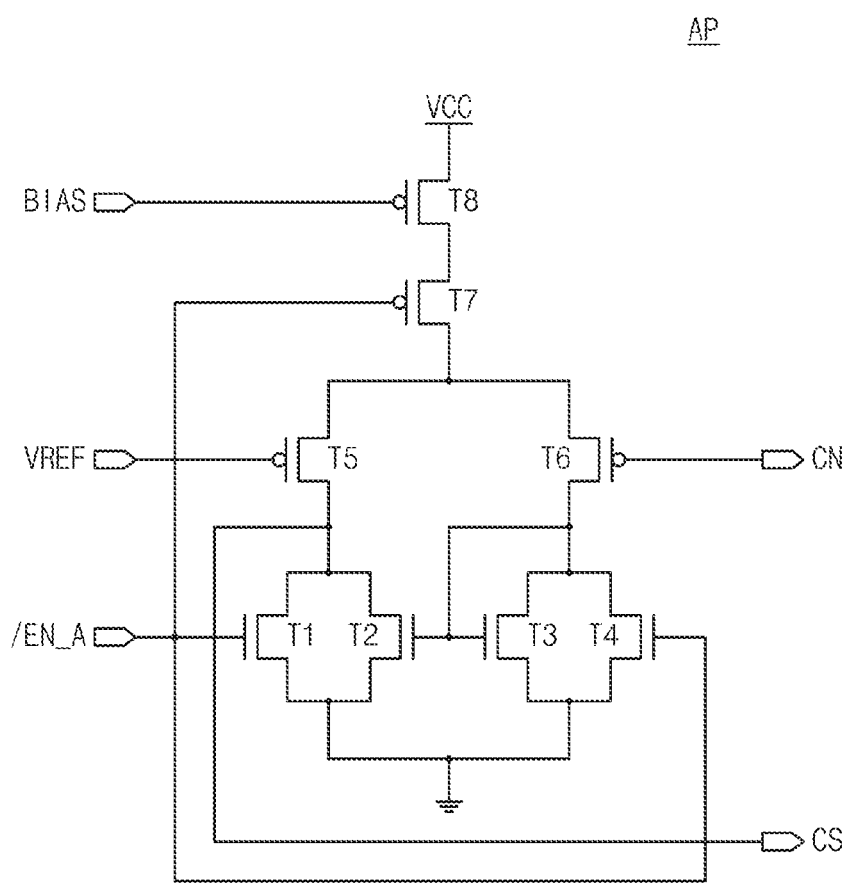
FIG. 4 is a circuit diagram illustrating an amplifier of a charge control circuit according to example embodiments of inventive concepts.

FIG. 4 is a circuit diagram illustrating an amplifier AP of a charge control circuit CCC2 according to example embodiments of inventive concepts. Referring to FIG. 4, the amplifier AP may include first to eighth transistors T1 to T8.

The first transistor T1 may have a gate configured to receive an inverted amplification enable signal /EN_A, a first node connected to the clamp switch CS, and a second node connected to a ground node. The second transistor T2 may have a gate connected with a gate of the third transistor T3, a first node connected with the clamp switch CS, and a second node connected with the ground node. The first and second transistors T1 and T2 may be connected in parallel.

The third transistor T3 may have a gate connected with the gate of the second transistor T2, a first node connected with the gate of the third transistor T3 to form a diode connection, and a second node connected with the ground node. The fourth transistor T4 may have a gate configured to receive the inverted amplification enable signal /EN_A, a first node connected with the first node of the third transistor T3, and a second node connected with the ground node.

The fifth transistor T5 may have a gate to which the reference voltage VREF is supplied, a first node connected with a second node of the seventh transistor T7, and a second node connected with the clamp switch CS. The sixth transistor T6 may have a gate connected with the charge node CN, a first node connected with the second node of the seventh transistor T7, and a second node connected with the first node of the third transistor T3.

The seventh transistor T7 may have a gate to which the inverted amplification enable signal /EN_A, the first node connected with a second node of the eighth transistor T8, and the second node connected with the first node of the fifth transistor T5. The eighth transistor T8 may have a gate to which a bias voltage BIAS is supplied, a first node connected with a power node to which the power supply voltage VCC is supplied, and the second node connected with the first node of the seventh transistor T7.

In example embodiments, each of the first to fourth transistors T1 to T4 may be of an NMOS type, and each of the fifth to eighth transistors T5 to T8 may be of a PMOS type.

The first transistor T1, the fourth transistor T4, and the seventh transistor T7 may determine activation or inactivation of the amplifier AP. When the amplifier AP is activated, the inverted amplification enable signal /EN_A may have a low level. In this case, the first and fourth transistors T1 and T4 may be turned off, while the seventh transistor T7 may be turned on.

The second transistor T2, the third transistor T3, the fifth transistor T5, and the sixth transistor T6 may constitute a differential amplifier. The eighth transistor T8 may function as a current controller which adjusts the amount of current flowing inside the amplifier AP based on the bias voltage BIAS.

When the amplifier AP is inactivated, the inverted amplification enable signal /EN_A may have a high level. In this case, the seventh transistor T7 may be turned off, and thus a current path may be blocked. As the first transistor T1 is turned on by the inverted amplification enable signal /EN_A of the high level, the clamp switch CS may be connected to the ground node through the turned-on first transistor T1. Because the fourth transistor T4 is turned on by the inverted amplification enable signal /EN_A of the high level, the first node of the third transistor T3 may be connected to the ground node through the turned-on fourth transistor T4.

Referring to. FIGS. 3 and 4, the amplifier AP included in the charge control circuit CCC2 may need at least 8 transistors, and thus the complexity and area of the driver circuit 12 may increase. In addition, the amplifier AP may include a first current path implemented with the fifth transistor T5 and a second current path implemented with the sixth transistor T6. Since a current is consumed through two current paths, current consumption of the driver circuit 12 may increase.

Figure 5:
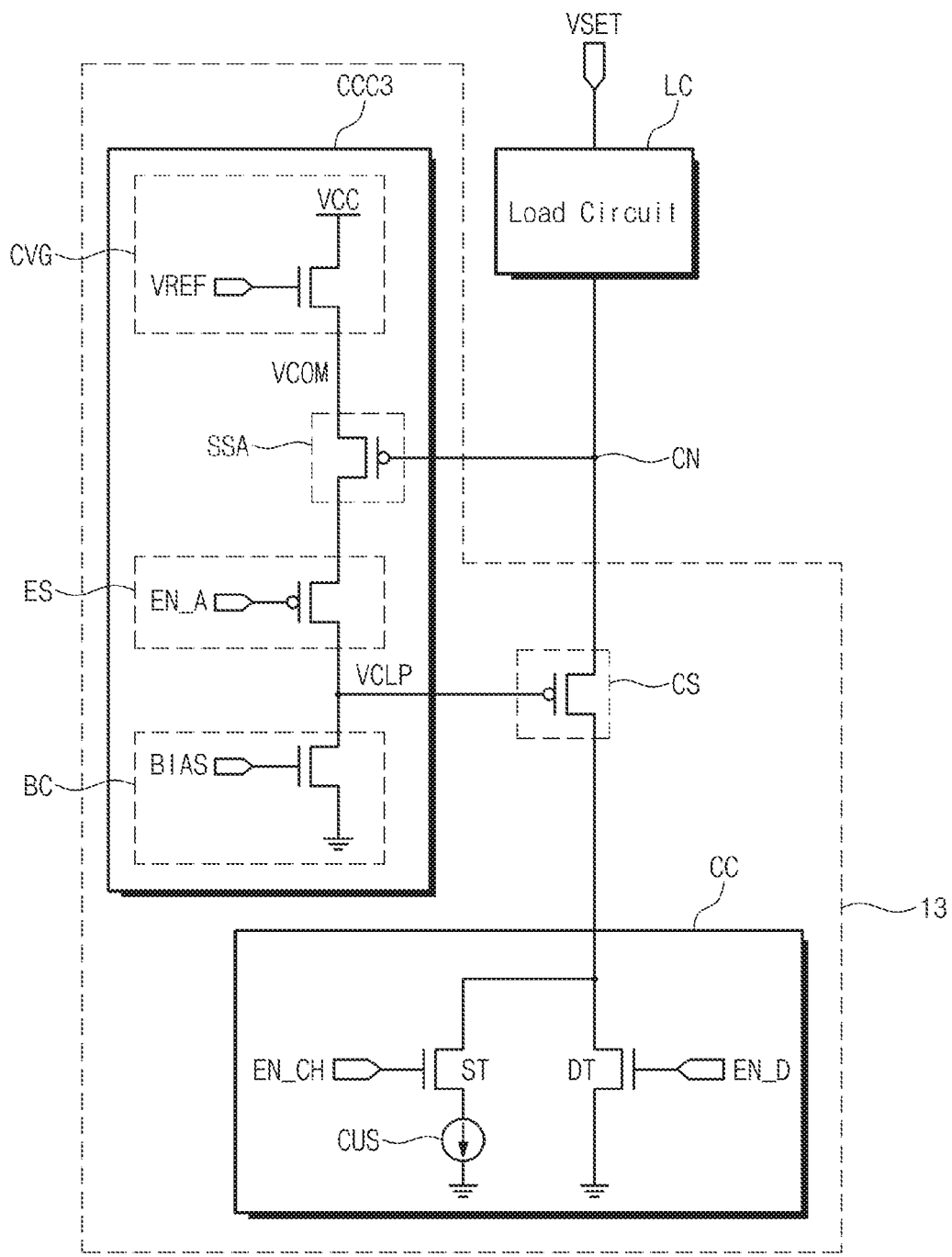
FIG. 5 is a diagram illustrating an application of a driver circuit according to example embodiments of inventive concepts.

FIG. 5 is a diagram illustrating an application of a driver circuit 13 according to example embodiments of inventive concepts. Compare with FIG. 1, a charge control circuit CCC3 of a driver circuit 13 is in more detail illustrated in FIG. 5. Referring to FIG. 5, a charge control circuit CCC3 may include a bias circuit BC, an enable switch ES, a single stage amplifier SSA, and a comparison voltage generator CVG.

The bias circuit BC may be connected to a gate of the clamp switch CS. The bias circuit BC may be configured to adjust the amount of current flowing to the ground node, to which a ground voltage is supplied, through the comparison voltage generator CVG, the single stage amplifier SSA, and the bias circuit BC in response to the bias voltage BIAS. For example, the bias circuit BC may function as a current source which allows a current to flow to the ground node in response to the bias voltage BIAS. The bias circuit BC may be connected between a gate of the clamp switch CS and the ground node and may include a transistor which is controlled by the bias voltage BIAS. For example, the bias circuit BC may include an NMOS transistor.

The enable switch ES may be connected between the bias circuit BC and the single stage amplifier SSA. The enable switch ES may determine activation or inactivation of the charge control circuit CCC3. The enable switch ES may be connected between the bias circuit BC and the single stage amplifier SSA and may include a transistor which operates in response to an amplification enable signal EN_A. When the amplification enable signal EN_A is activated, the transistor of the enable switch ES may be turned on, and thus the charge control circuit CCC3 may be activated. When the amplification enable signal EN_A is inactivated, the transistor of the enable switch ES may be turned off, and thus the charge control circuit CCC3 may be inactivated. For example, the enable switch ES may include a PMOS transistor.

The single stage amplifier SSA may be connected between the comparison voltage generator CVG and the enable switch ES. The single stage amplifier SSA may amplify a difference between a comparison voltage VCOM from the comparison voltage generator CVG and a voltage of the charge node CN and may output the amplified voltage as the clamp voltage VCLP through the enable switch ES. For example, the single stage amplifier SSA may include a gate connected to the charge node CN, a first node configured to receive the comparison voltage VCOM from the comparison voltage generator CVG, and a second node outputting the clamp voltage VCLP through the enable switch ES. For example, the single stage amplifier may include a PMOS transistor.

The comparison voltage generator CVG may output the comparison voltage VCOM which is determined according to the reference voltage VREF. The comparison voltage generator CVG may have a gate to which the reference voltage VREF is supplied, a first node connected with the power node to which the power supply voltage VCC is supplied, and a second node outputting the comparison voltage VCOM. For example, the comparison voltage generator CVG may include an NMOS transistor.

The driver circuit 13 may drive the internal conductive paths of the load circuit LC or the charge node CN with a voltage lower than a current voltage. Below, an operation of the driver circuit 13 will be described in more detail.

When the driver circuit 13 is activated, the enable switch ES may be turned on. For descriptive convenience, further description about the enable switch ES is omitted. The bias circuit BC may function as a current source through which a constant current determined by the bias voltage BIAS flows. The comparison voltage generator CVG may compare the reference voltage VREF and the power supply voltage VCC to output the comparison voltage VCOM, lower than the power supply voltage VCC by a threshold voltage of the transistor of the comparison voltage generator CVG, as the comparison result.

Since the comparison voltage VCOM is supplied to the first node of the single stage amplifier SSA and the bias circuit BC functioning as a current source is connected to the second node thereof, the single stage amplifier SSA may function as a common source amplifier. The single stage amplifier SSA may have a negative gain. The single stage amplifier SSA may amplify a difference between the comparison voltage VCOM and a voltage of the charge node CN with a negative gain and may output the amplified voltage as the clamp voltage VCLP.

At an initial state in which a charge starts, voltages of the internal conductive paths of the load circuit LC or a voltage of the charge node CN may be higher than the comparison voltage VCOM. Thus, the single stage amplifier SSA may output a voltage having an absolute value (e.g., an amplified value), which is greater than a difference between the comparison voltage VCOM and a voltage of the charge node CN and a negative sign, as the clamp voltage VCLP. The clamp switch CS may be turned on by the clamp voltage VCLP, and thus the charge circuit CC may allow a current to flow through the load circuit LC and the charge node CN. That is, voltages of the internal conductive paths of the load circuit LC and the charge node CN gradually decreases to the setting voltage VSET.

As voltages of the internal conductive paths of the load circuit LC and the charge node CN decrease, a voltage difference between the comparison voltage VCOM and the charge node CN may gradually decrease. When a voltage of the charge node CN reaches a voltage which is lower than the comparison voltage VCOM by a threshold voltage of the transistor of the single stage amplifier SSA, the single stage amplifier SSA may output the clamp voltage VCLP having a ground level or a positive level, and thus The clamp switch CS may be turned off. That is, the driver circuit 15 may allow a voltage of the charge node CN to follow a voltage which is lower than the reference voltage VREF by a voltage corresponding to a sum of a threshold voltage of the transistor of the comparison voltage generator CVG and a threshold voltage of the transistor of the single stage amplifier SSA. When the reference voltage VREF is set to a voltage which is higher than the setting voltage VSET by a voltage corresponding to a sum of a threshold voltage of the transistor of the comparison voltage generator CVG and a threshold voltage of the transistor of the single stage amplifier SSA, the internal conductive paths of the load circuit LC or the charge node CN may be driven with a voltage of which the level is the same as or similar to that of the setting voltage VSET. In detail, the clamp switch CS may be driven by an amplifier, e.g., the single stage amplifier SSA, and thus a driving capacity of the driver circuit 13 may be improved.

Even though the number of transistors constituting the charge control circuit CCC3 of FIG. 5 is smaller than that constituting the amplifier AP of FIG. 4, the charge control circuit CCC2, the charge control circuit CCC3 may provide the same abilities to set a target level of an output voltage using the reference voltage VREF and to improve a driving capacity through an amplification gain. In particular, the charge control circuit CCC3 of FIG. 5 may use only one current path, and thus the charge control circuit CCC3 may consume one-fourth of a current compared to the amplifier AP of FIG. 4. That is, when the charge control circuit CCC3 of FIG. 5 is used, a function to set the target level of the output voltage and to improve a driving capacity with the amplification gain may be maintained, but the power consumption and area of the driver circuit 13 may be reduced.

Figure 6:
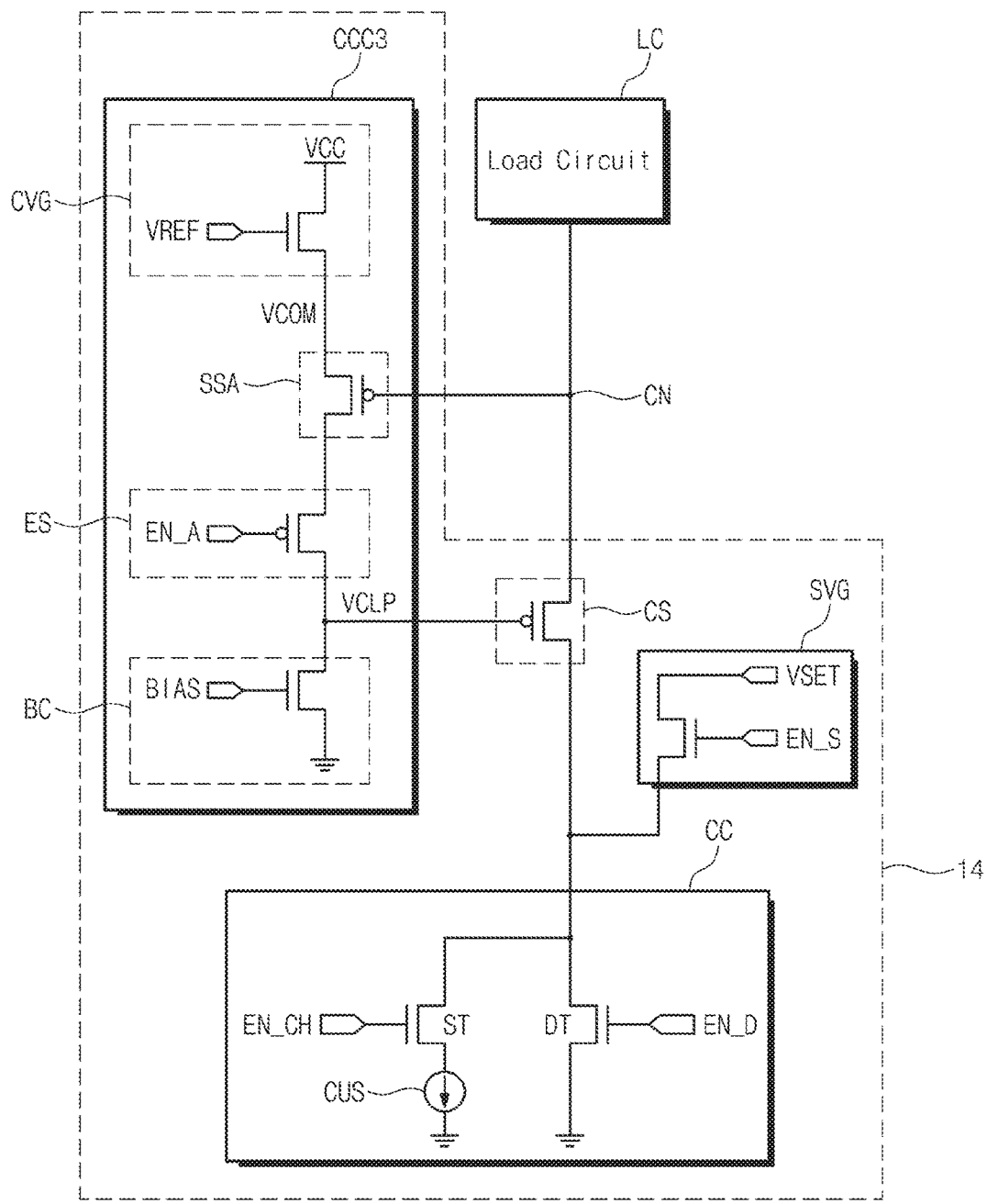
FIG. 6 is a block diagram illustrating an application of a driver circuit illustrated in FIG. 5.

FIG. 6 is a block diagram illustrating an application of a driver circuit 14 that is similar to the driving circuit 13 illustrated in FIG. 5. The driver circuit 14 of FIG. 6 may be different from the driver circuit 13 of FIG. 5 in that the setting voltage VSET is not applied to the load circuit LC and a setting voltage generator SVG is further included in the driver circuit 14. The setting voltage generator SVG may include a voltage node to which the setting voltage VSET is supplied and a transistor. The transistor may output the setting voltage VSET in response to a charge enable signal EN_CH. For example, when the transistor of the setting voltage generator SVG is turned on by set enable signal EN_S activated, the charge node CN or the internal conductive paths of the load circuit LC may be charged with the setting voltage VSET.

In FIG. 6, an example according to example embodiments of inventive concepts is provided as the setting voltage generator SVG supplies the setting voltage VSET to a node between the clamp switch CS and the charge circuit CC. However, the scope and spirit of inventive concepts may not be limited thereto. For example, the setting voltage generator SVG may be changed to supply the setting voltage VSET to a node electrically connected with the charge node CN in the driver circuit 14. For example, the setting voltage generator SVG may be configured to supply the setting voltage VSET to a node between the charge node CN and the clamp switch CS or directly to the charge node CN.

Figure 7:
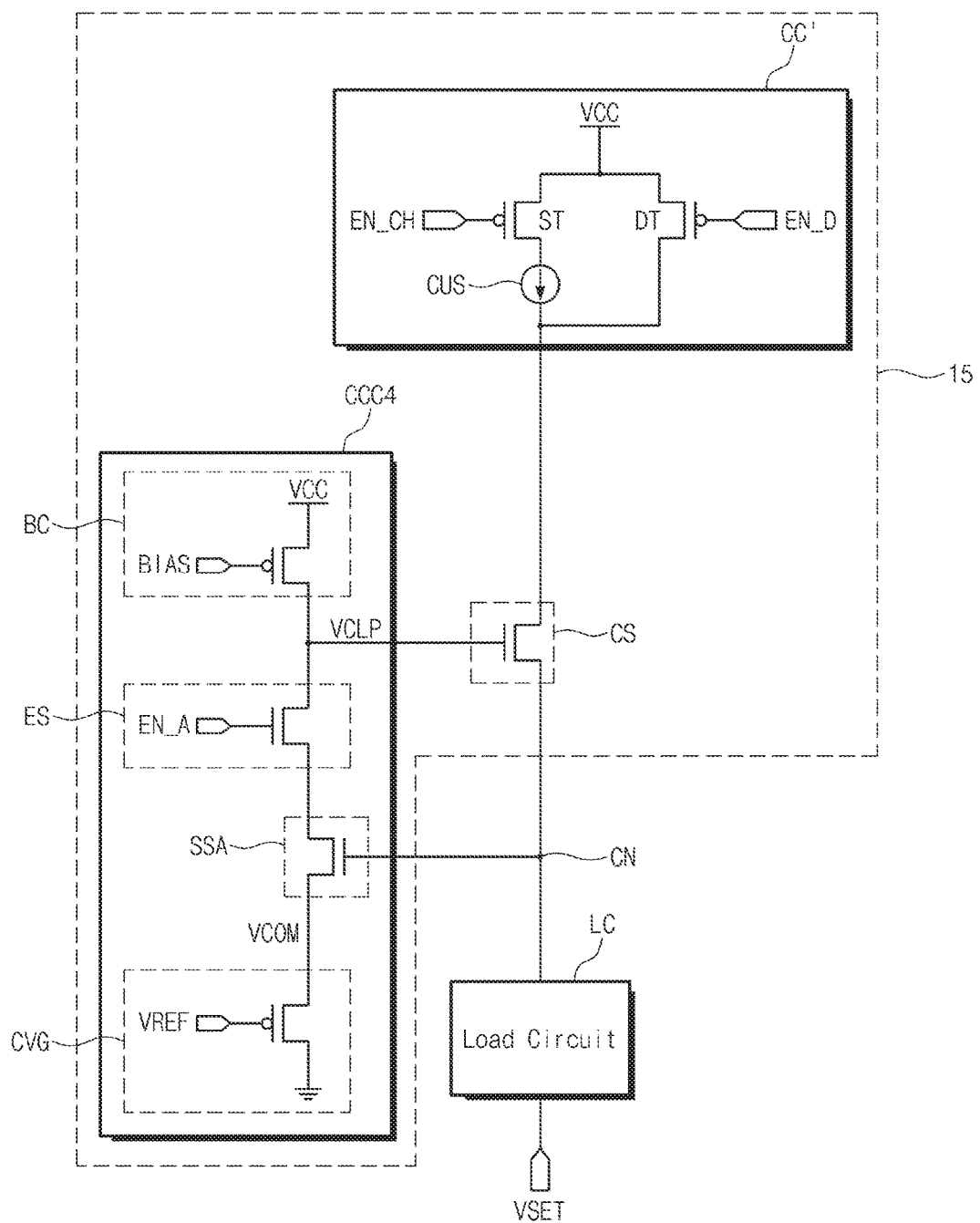
FIG. 7 is a block diagram illustrating another application of a driver circuit illustrated in FIG. 5.

FIG. 7 is a block diagram illustrating another application of a driver circuit 15 illustrated in FIG. 5. In example embodiments, the driver circuit 13 of FIG. 5 may be of a PMOS type, and the driver circuit 15 of FIG. 7 may be of an NMOS type. The clamp switch CS of the driver circuit 13 of FIG. 5 may be of a PMOS type, and a clamp switch CS of the driver circuit 13 of FIG. 7 may be of an NMOS type. In addition, a charge control circuit CCC4 of the driver circuit 13 of FIG. 7 may be different from the charge control circuit CCC3 of the driver circuit 13 of FIG. 5 in structure.

Compared to the charge circuit CC of FIG. 5, a charge circuit CC' of FIG. 7 may include a discharge transistor DT, a set transistor ST, and a current source CUS. The discharge transistor DT may be connected between the power node, to which the power supply voltage VCC is supplied, and the clamp switch CS. The discharge transistor DT may operate in response to a discharge enable signal EN_D. The discharge enable signal EN_D may be activated upon discharging of the internal conductive paths of the load circuit LC or the charge node CN. When the discharge enable signal EN_D is activated, the discharge transistor DT may be turned on, and thus the internal conductive paths of the load circuit LC or the charge node CN may be connected with the power node.

The set transistor ST and the current source CUS may be connected in series between the power node and the clamp switch CS. The set transistor ST may operate in response to the charge enable signal EN_CH. When the charge enable signal EN_CH is activated, the set transistor ST may be turned on, and thus the internal conductive paths of the load circuit LC or the charge node CN may be connected with the current source CUS. In FIG. 7, an example according to example embodiments of inventive concepts is provided as the set transistor ST is disposed at a power node side and the current source CUS is disposed at a clamp switch (CS) side. However, the scope and spirit of inventive concepts may not be limited thereto. For example, positions of the set transistor ST and the current source CUS may be changed.

In addition, an example according to example embodiments of inventive concepts is provided in FIG. 7 as the discharge transistor DT is connected with the power node. However, the scope and spirit of inventive concepts may not be limited thereto. For example, the discharge transistor DT may be connected with a voltage node, not the ground node. For example, the discharge transistor DT may be connected to a ground node to which a ground voltage is supplied.

Referring to FIG. 7, a charge control circuit CCC4 may include a bias circuit BC, an enable switch ES, a single stage amplifier SSA, and a comparison voltage generator CVG.

The bias circuit BC may be connected to a gate of the clamp switch CS. The bias circuit BC may be configured to adjust the amount of current flowing to the ground node, to which a ground voltage is supplied, through the comparison voltage generator CVG, the single stage amplifier SSA, and the bias circuit BC in response to the bias voltage BIAS. For example, the bias circuit BC may function as a current source which outputs a current in response to the bias voltage BIAS. The bias circuit BC may be connected between a gate of the clamp switch CS and the power node and may include a transistor which is controlled by the bias voltage BIAS. For example, the bias circuit BC may include a PMOS transistor.

The enable switch ES may be connected between the bias circuit BC and the single stage amplifier SSA. The enable switch ES may determine activation or inactivation of the charge control circuit CCC4. The enable switch ES may be connected between the bias circuit BC and the single stage amplifier SSA and may include a transistor which operates in response to an amplification enable signal EN_A. When the amplification enable signal EN_A is activated, the transistor of the enable switch ES may be turned on, and thus the charge control circuit CCC4 may be activated. When the amplification enable signal EN_A is inactivated, the transistor of the enable switch ES may be turned off, and thus the charge control circuit CCC4 may be inactivated. For example, the enable switch ES may include an NMOS transistor.

The single stage amplifier SSA may be connected between the comparison voltage generator CVG and the enable switch ES. The single stage amplifier SSA may amplify a difference between a comparison voltage VCOM from the comparison voltage generator CVG and a voltage of the charge node CN and may output the amplified voltage as the clamp voltage VCLP through the enable switch ES. For example, the single stage amplifier SSA may include a gate connected to the charge node CN, a first node configured to receive the comparison voltage VCOM from the comparison voltage generator CVG, and a second node outputting the clamp voltage VCLP through the enable switch ES. For example, the single stage amplifier SSA may include an NMOS transistor.

The comparison voltage generator CVG may output the comparison voltage VCOM which is determined according to the reference voltage VREF. The comparison voltage generator CVG may have a gate to which the reference voltage VREF is supplied, a first node connected with the ground node to which the ground voltage is supplied, and a second node outputting the comparison voltage VCOM. For example, the comparison voltage generator CVG may include a PMOS transistor.

The driver circuit 15 may drive the internal conductive paths of the load circuit LC or the charge node CN with a voltage higher than a current voltage. Below, an operation of the driver circuit 13 will be described in more detail.

When the driver circuit 15 is activated, the enable switch ES may be turned on. For descriptive convenience, further description about the enable switch ES is omitted. The bias circuit BC may function as a current source through which a constant current flows. The comparison voltage generator CVG may compare the reference voltage VREF and the ground voltage to output the comparison voltage VCOM, higher than the ground voltage by a threshold voltage of the transistor of the comparison voltage generator CVG, as the comparison result.

Since the comparison voltage VCOM is supplied to the first node of the single stage amplifier SSA and the bias circuit BC functioning as a current source is connected to the second node thereof, the single stage amplifier SSA may function as a common source amplifier. The single stage amplifier SSA may have a negative gain. The single stage amplifier SSA may amplify a difference between the comparison voltage VCOM and a voltage of the charge node CN with a negative gain and may output the amplified voltage as the clamp voltage VCLP.

At an initial state in which a charge starts, voltages of the internal conductive paths of the load circuit LC or a voltage of the charge node CN may be lower than the comparison voltage VCOM. Thus, the single stage amplifier SSA may output a voltage having an absolute value (e.g., an amplified value), which is greater than a difference between the comparison voltage VCOM and a voltage of the charge node CN and a positive sign, as the clamp voltage VCLP. The clamp switch CS may be turned on by the clamp voltage VCLP, and thus the charge circuit CC' may allow a current to flow through the load circuit LC and the charge node CN. That is, voltages of the internal conductive paths of the load circuit LC and the charge node CN may gradually increase to the setting voltage VSET.

As the voltages of the internal conductive paths of the load circuit LC and the charge node CN increase, a voltage difference between the comparison voltage VCOM and a voltage of the charge node CN may gradually decrease. When a voltage of the charge node CN reaches a voltage which is higher than the comparison voltage VCOM by a threshold voltage of the transistor of the single stage amplifier SSA, the single stage amplifier SSA may output the clamp voltage VCLP having a ground level or a negative level, and thus the clamp switch CS may be turned off. That is, the driver circuit 15 may allow a voltage of the charge node CN to follow a voltage which is higher than the reference voltage VREF by a voltage corresponding to a sum of a threshold voltage of the transistor of the comparison voltage generator CVG and a threshold voltage of the transistor of the single stage amplifier SSA. When the reference voltage VREF is set to a voltage which is lower than the setting voltage VSET by a voltage corresponding to a sum of a threshold voltage of the transistor of the comparison voltage generator CVG and a threshold voltage of the transistor of the single stage amplifier SSA, the internal conductive paths of the load circuit LC or the charge node CN may be driven with a voltage of which the level is the same as or similar to that of the setting voltage VSET. In particular, the clamp switch CS may be driven by an amplifier, especially the single stage amplifier SSA, and thus a driving capacity of the driver circuit 15 may be improved.

Even though the number of transistors constituting the charge control circuit CCC4 of FIG. 7 is smaller than that constituting the amplifier AP of FIG. 4, the charge control circuit CCC4 may provide the same abilities to set a target level of an output voltage using the reference voltage VREF and to improve a driving capacity through an amplification gain. In particular, the charge control circuit CCC4 of FIG. 7 may use only one current path, and thus the charge control circuit CCC4 may consume one-fourth of a current compared to the amplifier AP of FIG. 4. That is, when the charge control circuit CCC4 of FIG. 7 is used, a function to set the target level of the output voltage and to improve the driving capacity with the amplification gain may be maintained, but the power consumption and area of the driver circuit 15 may be reduced.

Figure 8:
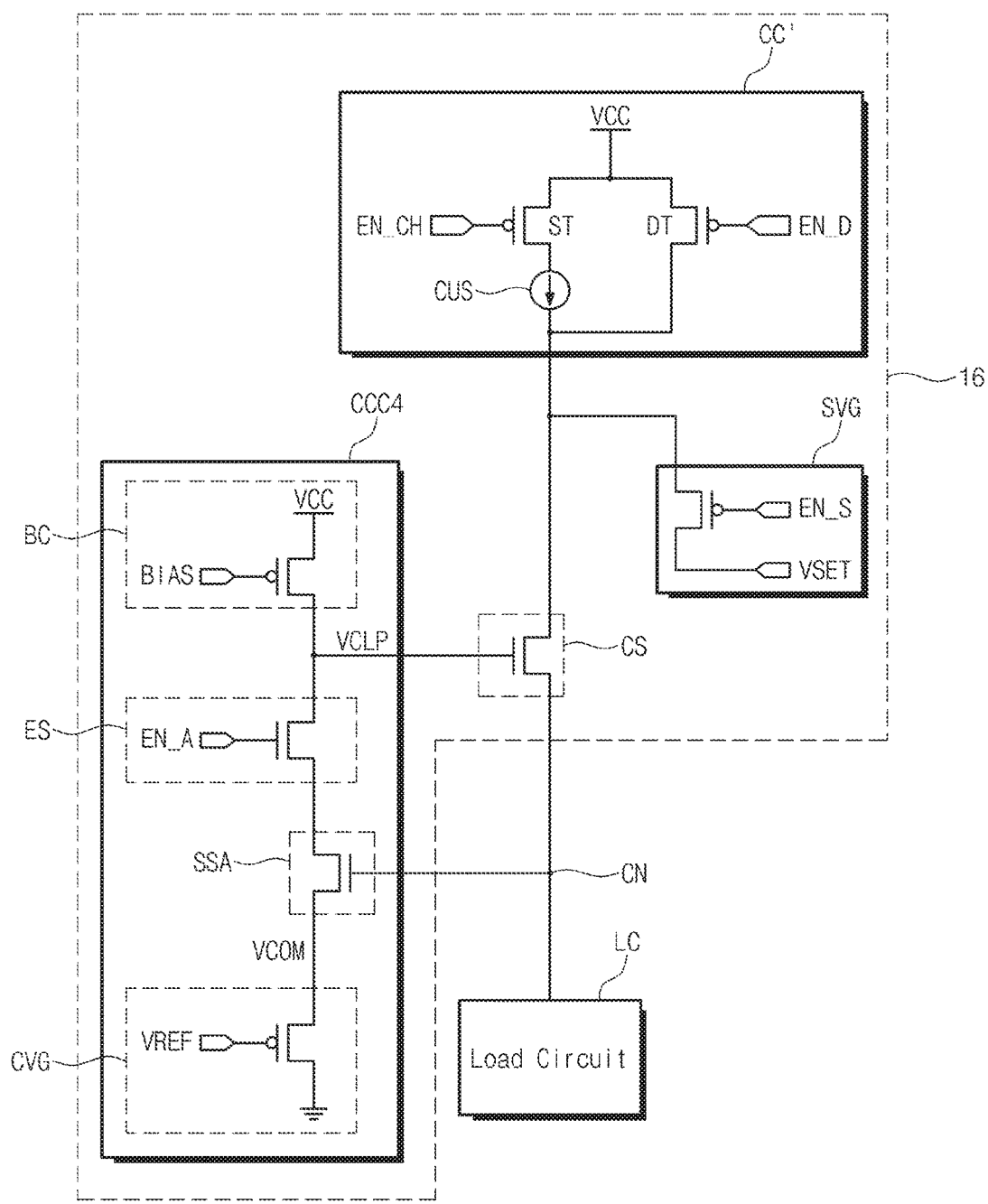
FIG. 8 is a block diagram illustrating an application of a driver circuit illustrated in FIG. 7.

FIG. 8 is a block diagram illustrating an application of a driver circuit 16. A driver circuit 16 of FIG. 8 may be different from the driver circuit 15 of FIG. 7 in that the setting voltage VSET is not applied to the load circuit LC and a setting voltage generator SVG is further included in the driver circuit 15. The setting voltage generator SVG may include a voltage node to which the setting voltage VSET is supplied and a transistor. The transistor may output the setting voltage VSET in response to a set enable signal EN_S. For example, when the transistor of the setting voltage generator SVG is turned on by set enable signal EN_S activated, the charge node CN or the internal conductive paths of the load circuit LC may be charged with the setting voltage VSET.

In FIG. 8, an example according to example embodiments of inventive concepts is provided as the setting voltage generator SVG supplies the setting voltage VSET to a node between the clamp switch CS and the charge circuit CC'. However, the scope and spirit of inventive concepts may not be limited thereto. For example, the setting voltage generator SVG may be changed to supply the setting voltage VSET to a node electrically connected with the charge node CN in the driver circuit 16. For example, the setting voltage generator SVG may be configured to supply the setting voltage VSET to a node between the charge node CN and the clamp switch CS or directly to the charge node CN.

Referring to FIGS. 5 through 8, various example embodiments of inventive concepts are described. At least two of driver circuits of FIGS. 5 through 8 may be embodied to a single load circuit. For example, one of driver circuits of FIGS. 5 and 6, which decrease a voltage of the charge node, and one of driver circuits of FIGS. 7 and 8, which increase a voltage of the charge node, may be embodied to adjust a voltage related with a single load circuit.

Figure 9:
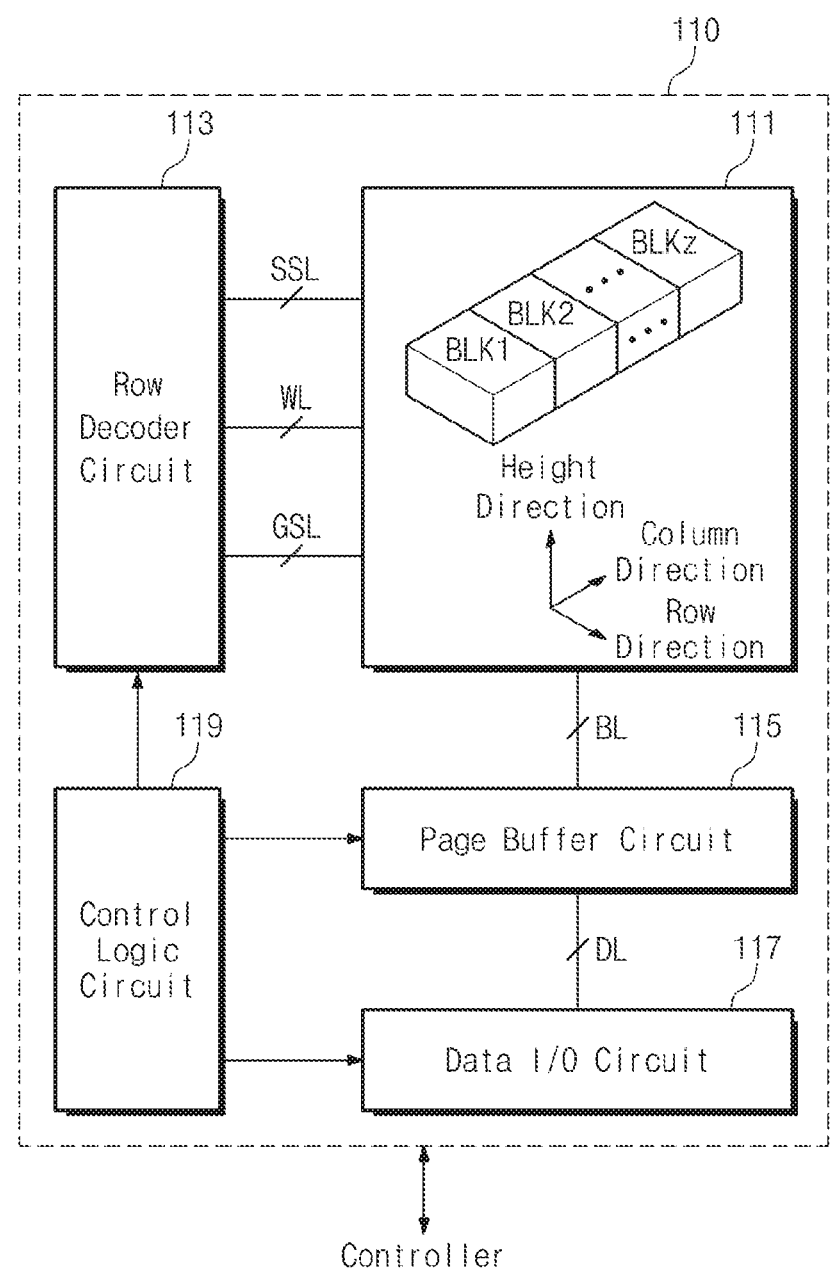
FIG. 9 is a block diagram illustrating a nonvolatile memory device to which a driver circuit according to example embodiments of inventive concepts is applied.

FIG. 9 is a block diagram illustrating a nonvolatile memory device to which a driver circuit according to example embodiments of inventive concepts is applied. In example embodiments, a NAND flash memory device is illustrated in FIG. 9.

Referring to FIG. 9, a nonvolatile memory device 110 may include a memory cell array 111, a row decoder circuit 113, a page buffer circuit 115, a data input/output circuit 117, and a control logic circuit 119.

The memory cell array 111 may include a plurality of memory cells BLK1 to BLKz. The memory blocks BLK1 to BLKz may be arranged along a column direction. Each memory block may have a three-dimensional structure extending along a row direction, a column direction, and a height direction. Each of the memory blocks BLK1 to BLKz may include a plurality of memory cells. Each of the memory blocks BLK1 to BLKz may be connected to the row decoder circuit 113 through at least one string selection line SSL, a plurality of word lines WL, and at least one ground selection line GSL. Each of the memory blocks BLK1 to BLKz may be connected to the page buffer circuit 115 through a plurality of bit lines BL. The bit lines BL may extend along the column direction, and the memory blocks BLK1 to BLKz may be connected in common to the bit lines BL. Memory cells in the memory blocks BLK1 to BLKz may have the same structures.

In example embodiments, each of the memory blocks BLK1 to BLKz may be a unit of an erase operation. The memory cells in the memory cell array 111 may be erased by the memory block. The memory cells in a memory block may be erased at the same time. In other embodiments, each memory block may be divided into a plurality of sub-blocks. Erasing may be made by the sub-block.

In example embodiments, each of the memory blocks BLK1 to BLKz may include a physical storage space which is distinguished by a block address. Each of the word lines WL may correspond to a physical storage space which is distinguished by a row address. Each of the bit lines BL may correspond to a physical storage space which is distinguished by a column address.

The row decoder circuit 113 may be connected to the memory cell array 111 through a plurality of ground selection lines GSL, the plurality of word lines WL, and a plurality of string selection lines SSL. The row decoder circuit 113 may operate according to control of the control logic circuit 119. The row decoder circuit 113 may decode an address received from a controller through an input/output channel, and may switch voltages to be applied to the at least one string selection line SSL, the word lines WL, and the at least on ground selection line GSL based on the decoded address.

For example, during a program operation, the row decoder circuit 113 may apply a program voltage to a selected word line in a memory block selected by an address. The row decoder circuit 113 may also apply a pass voltage to unselected word lines in the selected memory block. During a read operation, the row decoder circuit 113 may apply a selection read voltage to the selected word line in the selected memory block. The row decoder circuit 113 may also apply a non-selection read voltage to unselected word lines in the selected memory block. During an erase operation, the row decoder circuit 113 may apply an erase voltage (e.g., a ground voltage or a voltage of which the level is similar to that of the ground voltage) to word lines in the selected memory block.

The page buffer circuit 115 may be connected to the memory cell array 111 through the bit lines BL. The page buffer circuit 115 may be connected to the memory cell array 111 through the bit lines BL. The page buffer circuit 115 may operate under control of the control logic circuit 119.

During a program operation, the page buffer circuit 115 may store data to be programmed in memory cells. The page buffer circuit 115 may apply voltages to the bit lines BL based on the stored data. For example, the page buffer circuit 115 may function as a write driver. During a read operation, the page buffer circuit 115 may sense voltages on the bit lines BL and may store the sensed results. For example, the page buffer circuit 115 may function as a sense amplifier.

The data input/output circuit 117 may be connected to the page buffer circuit 115 through data lines DL. The data input/output circuit 117 may output data, which is read by the page buffer circuit 115, to the controller through an input/output channel and may transfer data, which is received from the controller through the input/output channel, to the page buffer circuit 115.

The control logic circuit 119 may receive a command from the controller through the input/output channel and may receive a control signal therefrom through a control channel. The control logic circuit 119 may receive a command through the input/output channel in response to the control signal, may route an address, which is received through the input/output channel, to the row decoder circuit 113, and may route data, which is received through the input/output channel, to the data input/output circuit 117. The control logic circuit 119 may decode the received command and may control the nonvolatile memory device 110 based on the decoded command.

In example embodiments, during a read operation, the control logic circuit 119 may generate a data strobe signal DQS based on a read enable signal /RE received from the controller through the control channel. The data strobe signal DQS thus generated may be outputted to the controller through the control channel. During a program operation, the control logic circuit 119 may receive the data strobe signal DQS from the controller through the control channel.

Figure 10:
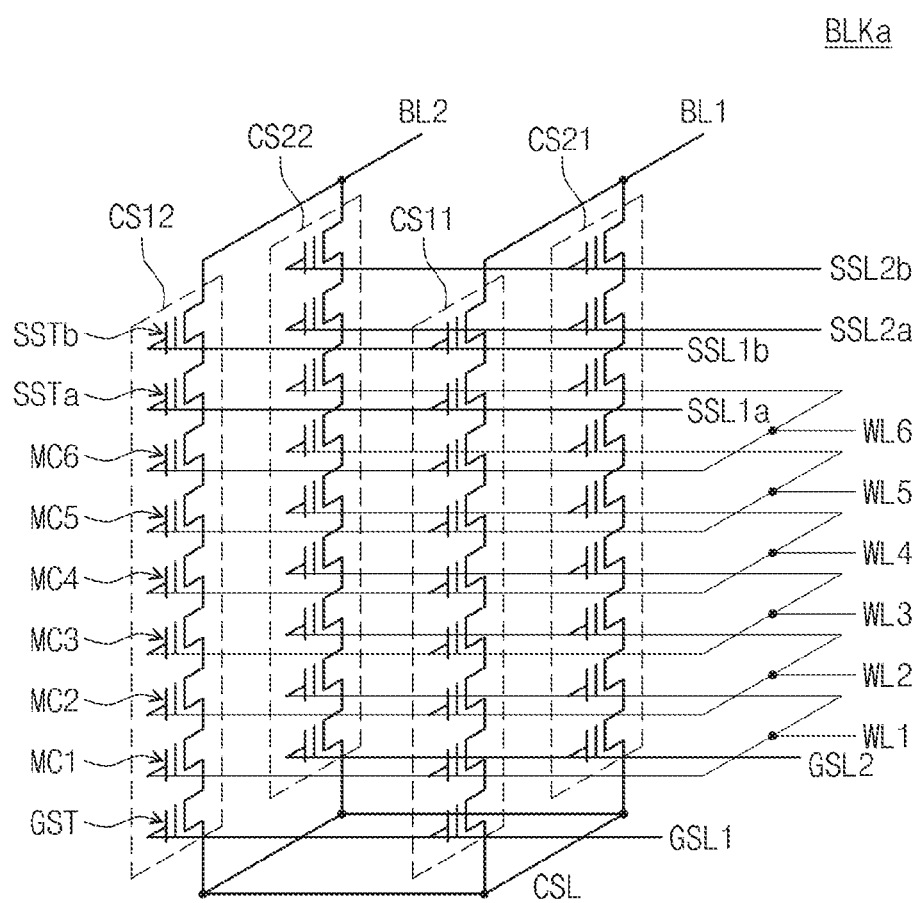
FIG. 10 is a circuit diagram illustrating a memory block according to example embodiments of inventive concepts.
Figure 10:
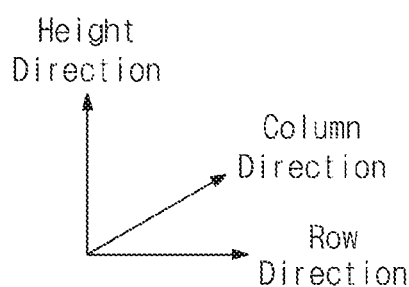

FIG. 10 is a circuit diagram illustrating a memory block BLKa according to example embodiments of inventive concepts. Referring to FIG. 10, a memory block BLKa may include a plurality of cell strings CS11 to CS21 and CS12 to CS22. The plurality of cell strings CS11 to CS21 and CS12 to CS22 may be arranged along a row direction and a column direction to constitute rows and columns.

For example, the cell strings CS11 and CS12 arranged along the row direction may constitute a first row, and the cell strings CS21 and CS22 arranged along the row direction may constitute a second row. The cell strings CS11 and CS21 arranged along the column direction may constitute a first column, and the cell strings CS12 and CS22 arranged along the column direction may constitute a second column.

Each cell string may contain a plurality of cell transistors. In each cell string, the cell transistors may include a ground selection transistor GST, memory cells MC1 to MC6, and string selection transistors SSTa and SSTb. The ground selection transistor GST, memory cells MC1 to MC6, and string selection transistors SSTa and SSTb in each cell string may be stacked in a height direction perpendicular to a plane (e.g., a plane on a substrate of the memory block BLKa) on which the cell strings CS11 to CS21 and CS12 to CS22 are arranged along the rows and the columns.

Each cell transistor may be a charge trap type cell transistor of which the threshold voltage changes according to the amount of charges trapped in an insulating layer thereof.

Sources of lowermost ground selection transistors GST may be connected in common to a common source line CSL.

Control gates of ground selection transistors GSTa of the cell strings CS11 and CS12 in a first row may be connected in common to a ground selection line GSL1, and control gates of ground selection transistors GSTb of the cell strings CS21 and CS22 in a second row may be connected in common to a ground selection line GSL2. That is, cell strings in different rows may be connected to different ground selection lines.

In example embodiments, the memory block BLKa may be modified or changed such that ground selection lines which are connected to ground selection transistors belonging to the same row and placed at different heights are connected to different ground selection lines. In example embodiments, the memory block BLKa may be modified or changed such that ground selection lines which are connected to ground selection transistors belonging to different rows and placed at the same height are interconnected and controlled in common. In example embodiments, the memory block BLKa may be modified or changed such that ground selection lines which are connected to ground selection transistors are interconnected and controlled in common.

Connected in common to a word line are control gates of memory cells that are placed at the same height (or order) from the substrate (or the ground selection transistors GST). Connected to different word lines WL1 to WL6 are control gates of memory cells that are placed at different heights (or, orders). For example, memory cells MC1 may be connected in common to a word line WL1. Memory cells MC2 may be connected in common to a word line WL2. Memory cells MC3 may be connected in common to a word line WL3. Memory cells MC4 may be connected in common to a word line WL4. Memory cells MC5 may be connected in common to a word line WL5. Memory cells MC6 may be connected in common to a word line WL6.

In the first string selection transistors SSTa of the cell strings CS11 to CS21 and CS12 to CS22 which have the same height (or order), control gates of the first string selection transistors SSTa in different rows may be connected to different string selection lines SSL1a and SSL2a. For example, the first string selection transistors SSTa of the cell strings CS11 and CS12 may be connected in common to the string selection line SSL1a. The first string selection transistors SSTa of the cell strings CS21 and CS22 may be connected in common to the string selection line SSL2a.

In the second string selection transistors SSTb of the cell strings CS11 to CS21 and CS12 to CS22 which have the same height (or order), control gates of the second string selection transistors SSTb in different rows may be connected to the different string selection lines SSL1b and SSL2b. For example, the second string selection transistors SSTb of the cell strings CS11 and CS12 may be connected in common to the string selection line SSL1b. The second string selection transistors SSTb of the cell strings CS21 and CS22 may be connected in common to the string selection line SSL2b.

That is, cell strings in different rows may be connected to different string selection lines. String selection transistors of cell strings which have the same height (or order) and belong to the same row may be connected to the same string selection line. String selection transistors of cell strings which have different heights (or orders) and belong to the same row may be connected to different string selection lines.

In example embodiments, string selection transistors of cell strings in the same row may be connected in common to a string selection line. For example, the string selection transistors SSTa and SSTb of the cell strings CS11 and CS12 in the first row may be connected in common to a string selection line. The string selection transistors SSTa and SSTb of the cell strings CS21 and CS22 in the second row may be connected in common to a string selection line.

Columns of the cell strings CS11 through CS21 and CS12 through CS22 may be connected to different bit lines BL1 and BL2, respectively. For example, the string selection transistors SSTb of the cell strings CS11 and CS21 in the first column may be connected in common to the bit line BL1. The string selection transistors SSTb of the cell strings CS12 and CS22 in the second column may be connected in common to the bit line BL2.

The cell strings CS11 and CS12 may constitute a first plane. The cell strings CS21 and CS22 may constitute a second plane.

In the memory block BLKa, memory cells of each plane placed at the same height may constitute a physical page. The physical page may refer to a unit by which the memory cells MC1 to MC6 are written and read. For example, one plane of the memory block BLKa may be selected by the string selection lines SSL1a, SSL1b, SSL2a, and SSL2b. The cell strings CS11 and CS12 in the first plane may be connected to the bit lines BL1 and BL2 when a turn-on voltage is respectively supplied to the string selection lines SSL1a and SSL1b and a turn-off voltage is respectively supplied to the string selection lines SSL2a and SSL2b. That is, the first plane may be selected. The cell strings CS21 and CS22 in a second plane may be connected to the bit lines BL1 and BL2 when the turn-on voltage is respectively supplied to the string selection lines SSL2a and SSL2b and the turn-off voltage is respectively supplied to the string selection lines SSL1a and SSL1b. That is, the second plane may be selected. In a selected plane, a row of memory cells MC may be selected by the word lines WL1 to WL6. In the selected row, a selection voltage may be applied to the second word line WL2, and a non-selection voltage may be respectively applied to remaining word lines WL1 and WL3 to WL6. That is, a physical page which corresponds to the second word line WL2 of the second plane may be selected by adjusting voltages of the string selection lines SSL1a, SSL1b, SSL2a, and SSL2b and the word lines WL1 to WL6. A write or read operation may be performed with respect to memory cells MC2 in the selected physical page.

For example, two or more bits may be written at each memory cell MC. Bits which are written at memory cells belonging to one physical page may be used to define logical pages. First bits which are written at memory cells belonging to one physical page may constitute a first logical page. N-th bits which are written at memory cells belonging to one physical page may constitute an N-th logical page. A logical page may refer to a data access unit. Data may be accessed by the logical page when a read operation is performed with respect to one physical page.

In the memory block BLKa, the memory cells MC1 to MC6 may be erased by the memory block or by the sub-block. When erasing is performed by the memory block, all memory cells MC in the memory block BLKa may be simultaneously erased according to an erase request (e.g., an erase request from an external controller). When erasing is performed by the sub-block, a portion of memory cells MC in the memory block BLKa may be simultaneously erased according to an erase request (e.g., an erase request from an external controller), and the others may be erase-inhibited. A low voltage (e.g., a ground voltage or a low voltage of which the level is similar to that of the ground voltage) may be supplied to a word line connected to memory cells MC to be erased, and a word line connected to erase-inhibited memory cells MC may be floated.

The memory block BLKa shown in FIG. 10 is an example. However, the scope and spirit of inventive concepts may not be limited thereto. For example, the number of rows of cell strings may increase or decrease. As the number of rows of cell strings is changed, the number of string or ground selection lines and the number of cell strings connected to a bit line may be also changed.

The number of columns of cell strings may increase or decrease. As the number of columns of cell strings is changed, the number of bit lines connected to columns of cell strings and the number of cell strings connected to a string selection line may be also changed.

A height of the cell strings may increase or decrease. For example, the number of ground selection transistors, memory cells, or string selection transistors that are stacked in each cell string may increase or decrease.

In example embodiments, memory cells MC in a physical page may correspond to at least three logical pages. For example, k bits (k being an integer of 2 or more) may be programmed in a memory cell MC. Memory cells MC of a physical page may store k logical pages each of which is composed of n-th bits respectively programmed in memory cells MC.

As described above, the memory block BLKa may be embodied as a three-dimensional memory array. The 3D memory array may be monolithically formed on a substrate (e.g., semiconductor substrate such as silicon, or semiconductor-on-insulator substrate). The 3D memory array may include two or more physical levels of memory cells having an active area disposed above the substrate and circuitry associated with the operation of those memory cells, whether such associated circuitry is above or within such substrate. The layers of each level of the array may be directly deposited on the layers of each underlying level of the array.

In example embodiments of inventive concepts, the 3D memory array includes vertical NAND strings (or cell strings) that are vertically oriented such that at least one memory cell is located over another memory cell. The at least one memory cell MC may include a charge trap layer. Each vertical NAND string may further include at least one selection transistor placed over the memory cells MC. The at least one selection transistor may have the same structure as the memory cells MC and may be formed uniformly with the memory cells MC.

The following patent documents, which are hereby incorporated by reference in their entirety, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654, 587; 8,559,235; and US Pat. Pub. No. 2011/0233648.

As described above, the memory blocks BLK1 to BLKz may share the bit lines BL. Each bit line may be connected with a plurality of cell strings in each memory block. Due to a resistive load and a capacitive load of each bit line, thus, a lot of time may be taken to drive each bit line up to a target voltage. The driver circuit 13, 14, 15, or 16 according to example embodiments of inventive concepts may be used to reduce a time taken to drive each bit line up to a target voltage. Likewise, the driver circuit 13, 14, 15, or 16 according to example embodiments of inventive concepts may be used to reduce a time taken to drive each word line up to a target voltage.

Figure 11:
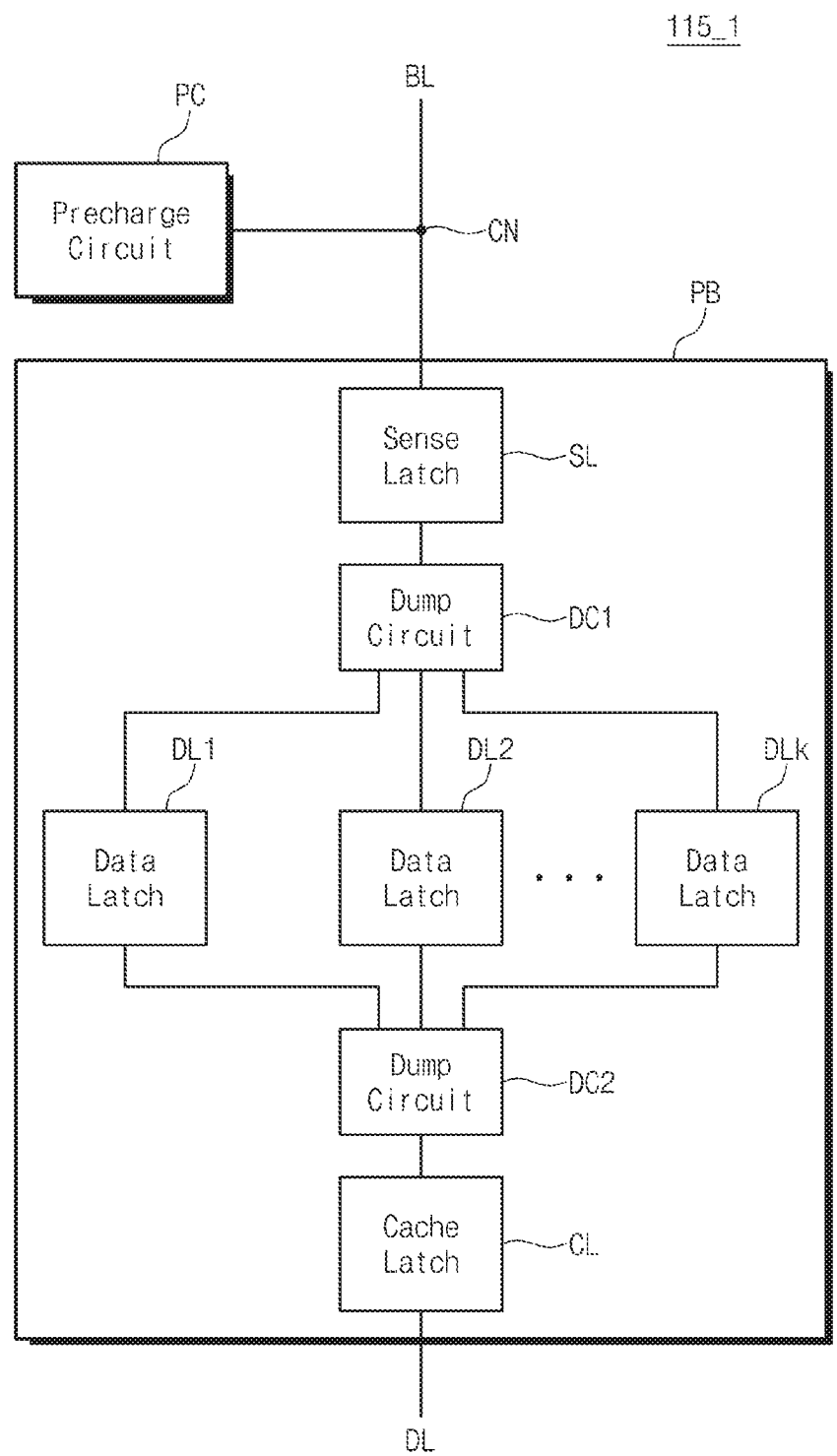
FIG. 11 is a block diagram illustrating a part of a page buffer circuit to which a driver circuit according to example embodiments of inventive concepts is applied.

FIG. 11 is a block diagram illustrating a part of a page buffer circuit 115 to which a driver circuit according to example embodiments of inventive concepts is applied. In example embodiments, components of the page buffer circuit 115 corresponding to one bit line BL are illustrated in FIG. 11. Referring to FIG. 11, a page buffer circuit 115_1 may include a precharge circuit PC and a page buffer PB which are connected to a bit line BL.

The page buffer PB may include a sense latch SL, a first dump circuit DC1, first to k-th data latches DL1 to DLk, a second dump circuit DC2, and a cache latch CL.

The sense latch SL may perform a bias operation in which a voltage (e.g., a setting voltage VSET) is applied to the bit line BL based on a stored bit or a sensing operation in which a bit stores according to a voltage on the bit line BL. The sense latch LL may store a bit transferred through the first dump circuit DC1 or may transfer a bit stored therein to the first dump circuit DC1.

The first dump circuit DC1 may store a bit at the sense latch SL based on bits stored in the data latches DL1 to DLk or may perform a dump operation to transfer a bit stored in the sense latch SL to one of the data latches DL1 to DLk.

Each of the data latches DL1 to DLk may store a bit transferred from the sense latch SL through the first dump latch DC1, that is, a bit read from a memory cell connected to the bit line BL. Alternatively, the data latches DL1 to DLk may store bits to be transferred to the sense latch SL through the first dump latch DC1, that is, bits to be written at a memory cell connected to the bit line BL. A data latch selected from the first to k-th data latches DL1 to DLk may transfer a bit stored therein to the second dump circuit DC2. A data latch selected from the first to k-th data latches DL1 to DLk may store a bit transferred from the second dump circuit DC2. The number of the data latches DL1 to DLk may be the same as or greater than the number of bits to be written at a memory cell connected to the bit line BL.

The second dump circuit DC2 may transfer data, stored in a data latch selected from the data latches DL1 to DLk, to the cache latch CL. The second dump circuit DC2 may transfer a bit stored in the cache latch CL to a data latch selected from the data latches DL1 to DLk.

The precharge circuit PC may include one or more of the driver circuits 13 to 16 described with reference to FIGS. 5 to 8. For example, the precharge circuit PC may be configured to charge the bit line BL with the setting voltage VSET (e.g., a power supply voltage). At this time, the precharge circuit PC may control the bit line BL using one or more driver circuits so as to follow a level the same as or similar to a level of the setting voltage VSET. In establishing the setting voltage VSET (e.g., a power supply voltage or a ground voltage) at the bit line BL by the sense latch SL, a voltage of the bit line BL may be adjusted to follow a level the same as or similar to a level of the setting voltage VSET.

In example embodiments, the sense latch SL may include one or more of the driver circuits 13 to 16 described with reference to FIGS. 5 to 8. For example, the sense latch SL may be configured to establish the ground voltage or the power supply voltage at the bit line BL based on a bit stored therein. The sense latch SL may perform the above-described biasing operation using one or more driver circuits.

Figure 12:
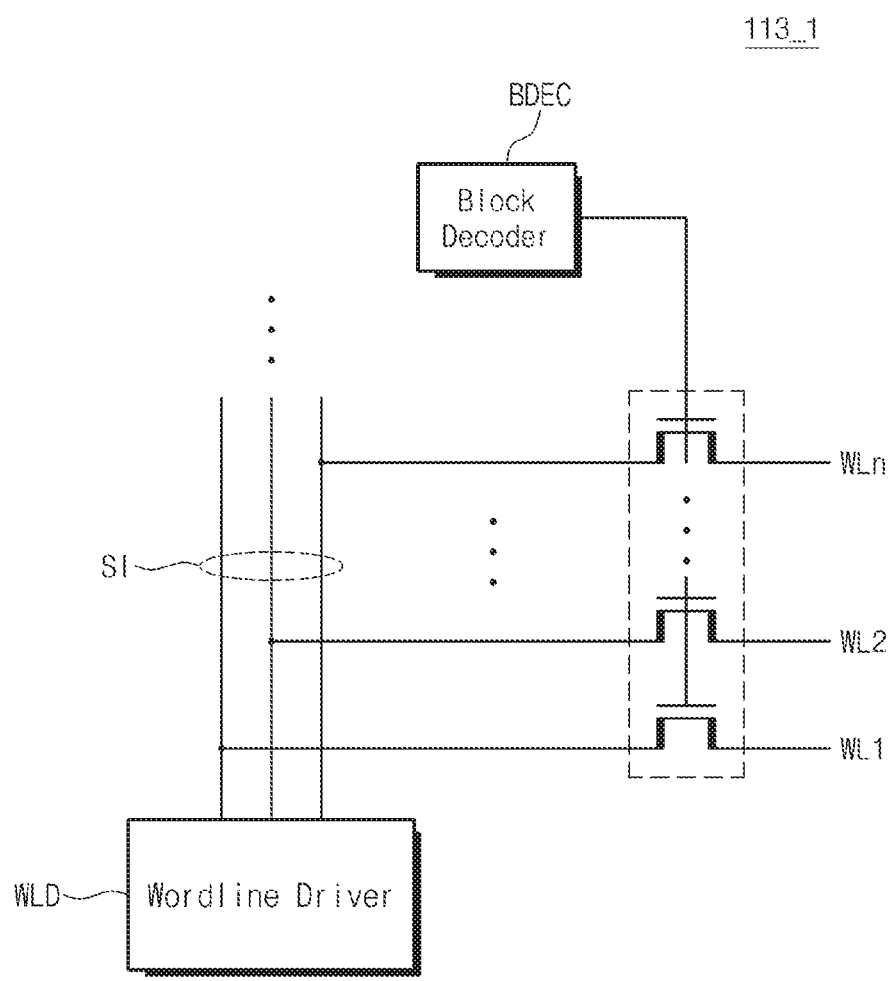
FIG. 12 is a block diagram illustrating a part of a row decoder circuit to which a driver circuit according to example embodiments of inventive concepts is applied.

FIG. 12 is a block diagram illustrating a part of a row decoder circuit 113 to which a driver circuit according to example embodiments of inventive concepts is applied. In example embodiments, components of a row decoder circuit 113_1 corresponding to one memory block are illustrated in FIG. 12. Referring to FIG. 12, the row decoder circuit 113_1 may include pass transistors respectively connected to word lines WL1 to WLn of a memory block, a block decoder BDEC, and a word line driver WLD.

The word line driver WLD may be configured to drive a plurality of internal lines SI. In example embodiments, the number of internal lines SI driven by the word line driver WLD may be the same as the number of word lines belonging to one memory block. The internal lines SI may correspond to word lines of each memory block.

The block decoder BDEC may select one of a plurality of memory blocks BLK1 to BLKz (refer to FIG. 9) based on a block address provided to the row decoder circuit 113_1. The block decoder BDEC may turn on the pass transistors PTR corresponding to the selected memory block. That is, the block decoder BDEC may electrically connect the word lines WL1 to BLn of the selected memory block to the internal lines SI, respectively.

The word line driver WLD may include one or more of the driver circuits 13 to 16 described with reference to FIGS. 5 to 8. The word line driver WLD may drive the internal lines SI and the word lines WL1 to WLn using one or more driver circuits.

A ground selection line driver which drives ground selection lines GSL and a string selection line driver which drives string selection lines SSL may be included in the row decoder circuit 113_1. Each of the string selection line driver and the ground selection line driver may be configured to drive corresponding selection lines using one or more driver circuits.

Figure 13:
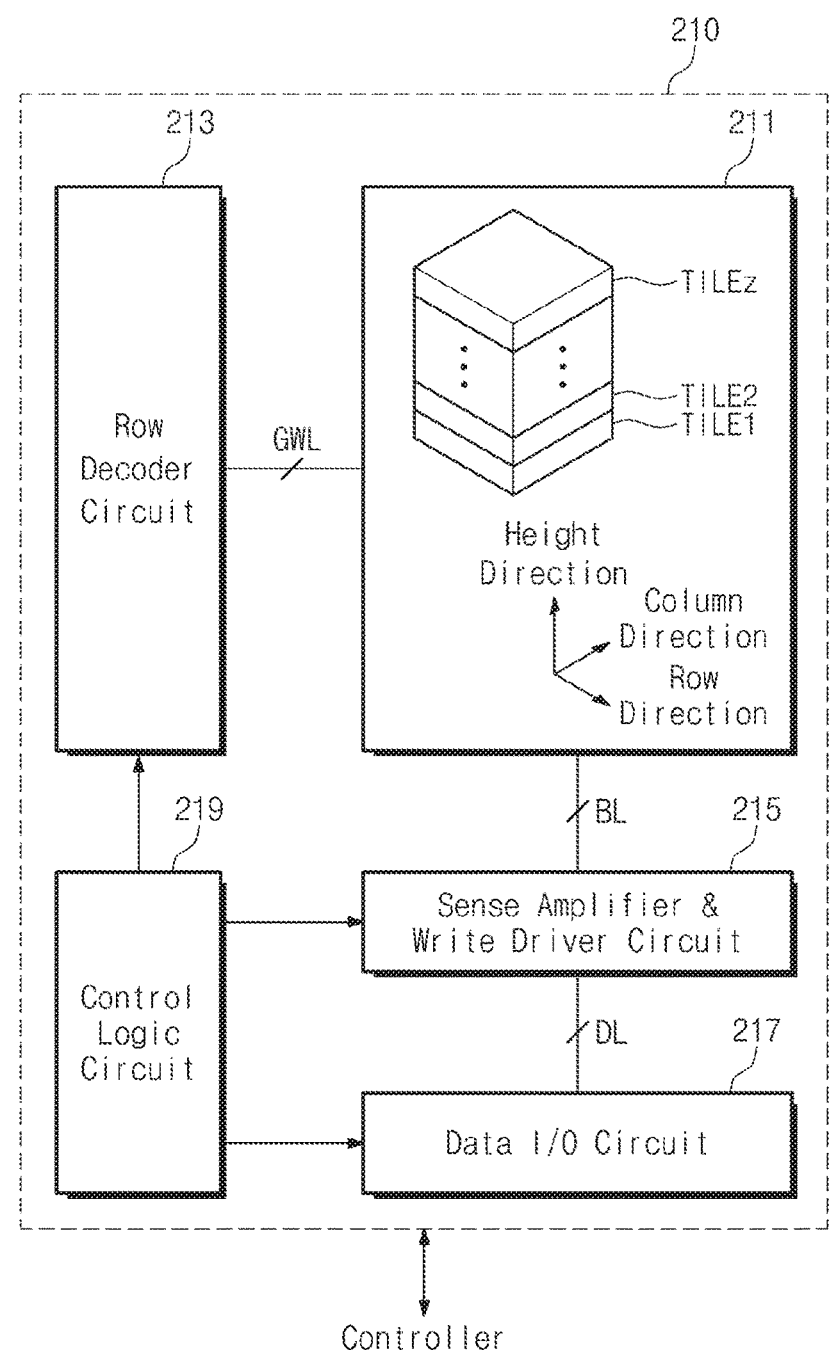
FIG. 13 is a block diagram illustrating another example of a nonvolatile memory device to which a driver circuit according to example embodiments of inventive concepts is applied.

FIG. 13 is a block diagram illustrating another example of a nonvolatile memory device to which a driver circuit according to example embodiments of inventive concepts is applied. In example embodiments, a cross-point type memory device is illustrated in FIG. 13. The cross-point type memory device may have a structure in which a memory cell connected with a word line and a bit line is disposed at an intersection (of a cross-point) of the word line and the bit line. In example embodiments, nonvolatile RAMs such as a resistive random access memory (RRAM), a phase-change RAM (PRAM), a ferroelectric RAM (FeRAM), and a magnetic RAM (MRAM) may be implemented to have a cross-point type.

Referring to FIG. 13, a nonvolatile memory device 210 may include a memory cell array 211, a row decoder circuit 213, a sense amplifier and write driver circuit 215, a data input/output circuit 217, and a control logic circuit 219.

The memory cell array 111 may include a plurality of memory tiles TILE1 to TILEz. The memory tiles TILE1 to TILEz may be arranged along a height direction. Each memory tile may have a three-dimensional structure extending along a row direction, a column direction, and a height direction. The memory tiles TILE1 to TILEz may be connected in common to the row decoder circuit 213 through a plurality of global word lines GWL. The memory tiles TILE1 to TILEz may be connected in common to the sense amplifier and write driver circuit 215 through a plurality of global bit lines GBL.

Each memory tile may include a plurality of memory cells. A plurality of memory cells of each memory tile may be connected to a plurality of word lines which are respectively connected with the global word lines GWL. Word lines belonging to each memory tile may be independent of other memory tiles. A plurality of memory cells of each memory tile may be connected to a plurality of bit lines which are respectively connected with the global bit lines GBL. Bit lines belonging to each memory tile may be independent of other memory tiles.

The row decoder circuit 213 may be connected to the memory cell array 211 through the global bit lines GBL. The row decoder circuit 213 may operate according to control of the control logic circuit 219. The row decoder circuit 213 may decode an address received from a controller through an input/output channel and may control voltages to be applied to the global word lines GWL based on the decoded address.

The sense amplifier and write driver circuit 215 may be connected to the memory cell array 211 through the global bit lines GBL. The sense amplifier and write driver circuit 215 may be connected to the data input output circuit 217 through a plurality of data lines DL. The sense amplifier and write driver circuit 215 may operate under control of the control logic circuit 219.

The data input/output circuit 217 may be connected to the sense amplifier and write driver circuit 215 through the data lines DL. The data input/output circuit 217 may output data, which is read by the sense amplifier and write driver circuit 215, to the controller through an input/output channel and may transfer data, which is received from the controller through the input/output channel, to the sense amplifier and write driver circuit 215.

The control logic circuit 219 may receive a command from the controller through the input/output channel and may receive a control signal therefrom through a control channel. The control logic circuit 219 may receive a command through the input/output channel in response to the control signal, may route an address, which is received through the input/output channel, to the row decoder circuit 213, and may route data, which is received through the input/output channel, to the data input/output circuit 217. The control logic circuit 219 may decode the received command and may control the nonvolatile memory device 210 based on the decoded command.

Figure 14:
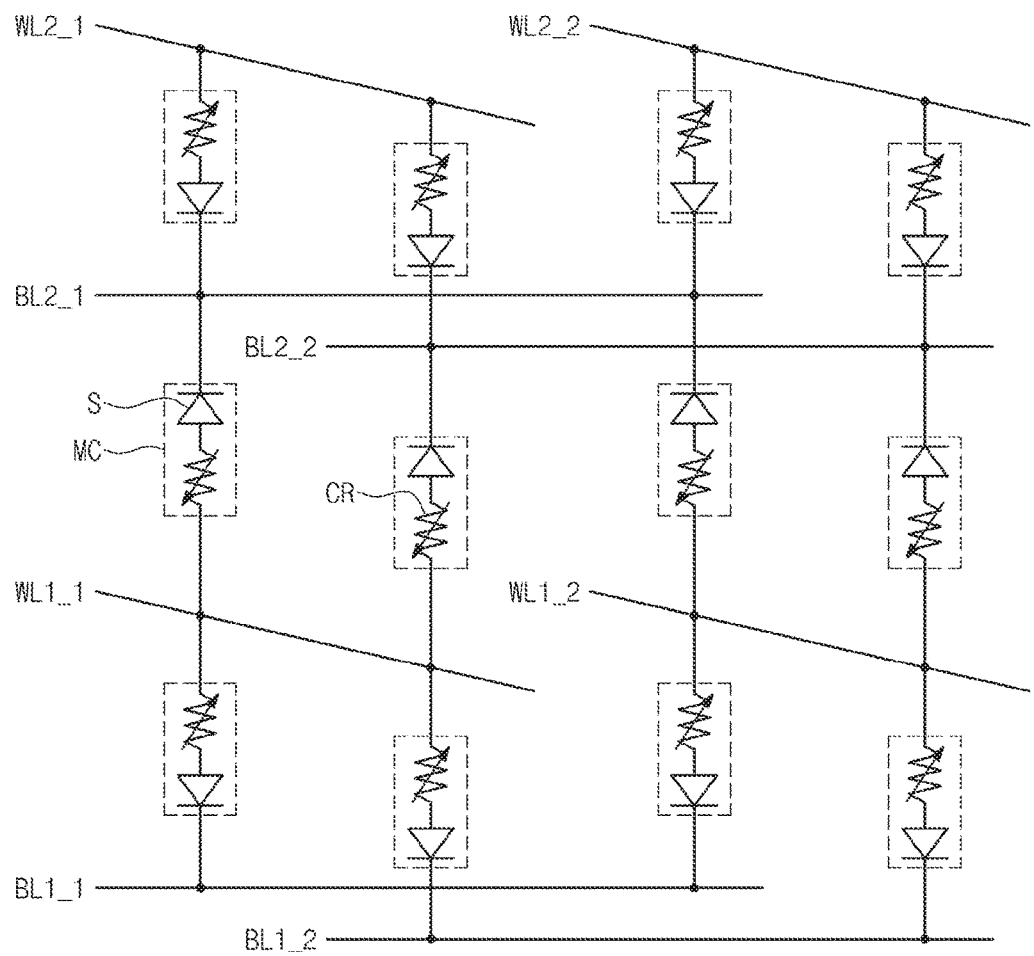
FIG. 14 is a circuit diagram illustrating a memory tile according to example embodiments of inventive concepts.

FIG. 14 is a circuit diagram illustrating a memory tile TILEk according to example embodiments of inventive concepts. As illustrated in FIG. 14, a memory tile TILEk may include word lines and bit lines sequentially stacked along a height direction. For example, in FIG. 14, bit lines BL1_1 and BL1_2 may be disposed at a first plane. The bit lines BL1_1 and BL1_2 may extend along a column direction and may be spaced from each other along a row direction.

Word lines WL1_1 and WL1_2 may be disposed at the second plane on the second plane. The word lines WL1_1 and WL1_2 may extend along a row direction and may be spaced from each other along a column direction.

Memory cells may be formed between the first plane and the second plane and may be respectively disposed at cross-points of the bit lines BL1_1 and BL1_2 and the word lines WL1_1 and WL1_2. Each memory cell may be connected to a word line and a bit line.

Bit lines BL2_1 and BL2_2 may be disposed at a third plane on the second plane. The bit lines BL2_1 and BL2_2 may extend along the column direction and may be spaced from each other along the row direction.

Memory cells may be formed between the second plane and the third plane and may be respectively disposed at cross-points of the bit lines BL2_1 and BL2_2 and the word lines WL1_1 and WL1_2. Each memory cell may be connected to a word line and a bit line.

Word lines WL2_1 and WL2_2 may be disposed at a fourth plane on the third plane. The word lines WL2_1 and WL2_2 may extend along the row direction and may be spaced from each other along the column direction.

Memory cells may be formed between the third plane and the fourth plane and may be respectively disposed at cross-points of the bit lines BL2_1 and BL2_2 and the word lines WL2_1 and WL2_2. Each memory cell may be connected to a word line and a bit line.

Each memory cell may include a variable resistor element VR and a selection element S. A resistance value of the variable resistor element VR may increase (e.g., may be set or written) when voltages of a word line and a bit line belong to a first condition. A resistance value of the variable resistor element VR may decrease (e.g., may be reset or erased) when voltages of a word line and a bit line belong to a second condition. A resistance value of the variable resistor element VR may be maintained when word line and bit line voltages do not belong to the first and second conditions.

The selection element S may include a diode. The selection element S may provide selectivity of a corresponding memory cell. For example, the selection element S may select a corresponding memory cell by passing a current based on voltages of a word line and a bit line. The selection element S may not select a corresponding memory cell by blocking a current based on voltages of a word line and a bit line. In example embodiments, the selection element S may be replaced with a transistor. In example embodiments, a method of controlling voltages of a word line and a bit line may be used to select each memory cell, instead of using the selection element S. For example, no current may flow to an unselected memory cell by setting a word line and a bit line, which are connected to the unselected memory cell, with the same voltage. A current may flow to an unselected memory cell by setting a word line and a bit line, which are connected to the unselected memory cell, with different voltages. In the case where the method of adjusting voltages is used instead of the selection element S, each memory cell may not include the selection element S.

The variable resistor element VR may be of a resistive type, a phase-change type, a magnetic type, or a ferroelectric type.

As described above, the memory tiles TILE1 to TILEz may share the global bit lines GBL. Each global bit line may be connected with a plurality of bit lines in each memory tile. Due to a resistive load and a capacitive load of each global bit line, thus, a lot of time may be taken to drive each global bit line up to a target voltage. The driver circuit 13, 14, 15, or 16 according to example embodiments of inventive concepts may be used to reduce a time taken to drive each global bit line up to a target voltage. Likewise, the driver circuit 13, 14, 15, or 16 according to example embodiments of inventive concepts may be used to reduce a time taken to drive each global word line up to a target voltage.

Figure 15:
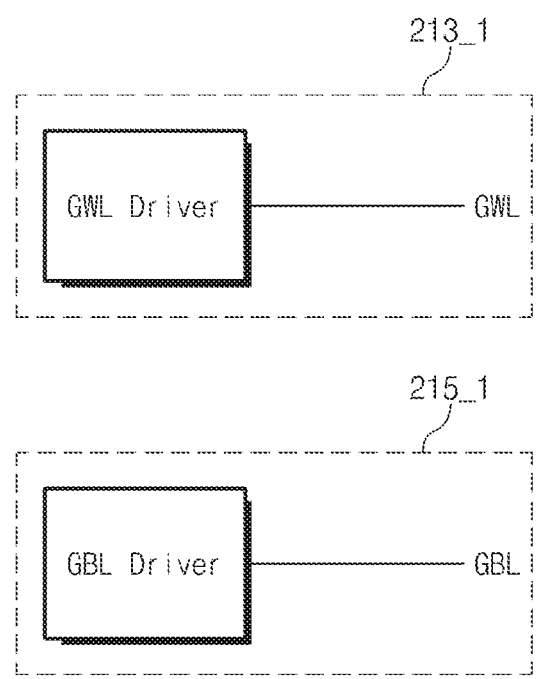
FIG. 15 is a block diagram partially illustrating a row decoder circuit and a sense amplifier and write driver circuit to each of which a driver circuit according to example embodiments of inventive concepts is applied.

FIG. 15 is a block diagram partially illustrating a row decoder circuit 213_1 and a sense amplifier and write driver circuit 215_1 to each of which a driver circuit according to example embodiments of inventive concepts is applied.

Referring to FIG. 15, a row decoder circuit 213_1 may include a global word line driver corresponding to a global word line GWL. The global word line driver may be configured to drive a global word line using one or more of the driver circuits 13 to 16 described with reference to FIGS. 5 to 8.

A sense amplifier and write driver circuit 215_1 may include a global bit line driver which drives a global bit line. The global bit line driver 215_1 may be configured to drive a global bit line GBL using one or more of the driver circuits 13 to 16 described with reference to FIGS. 5 to 8.

Figure 16:
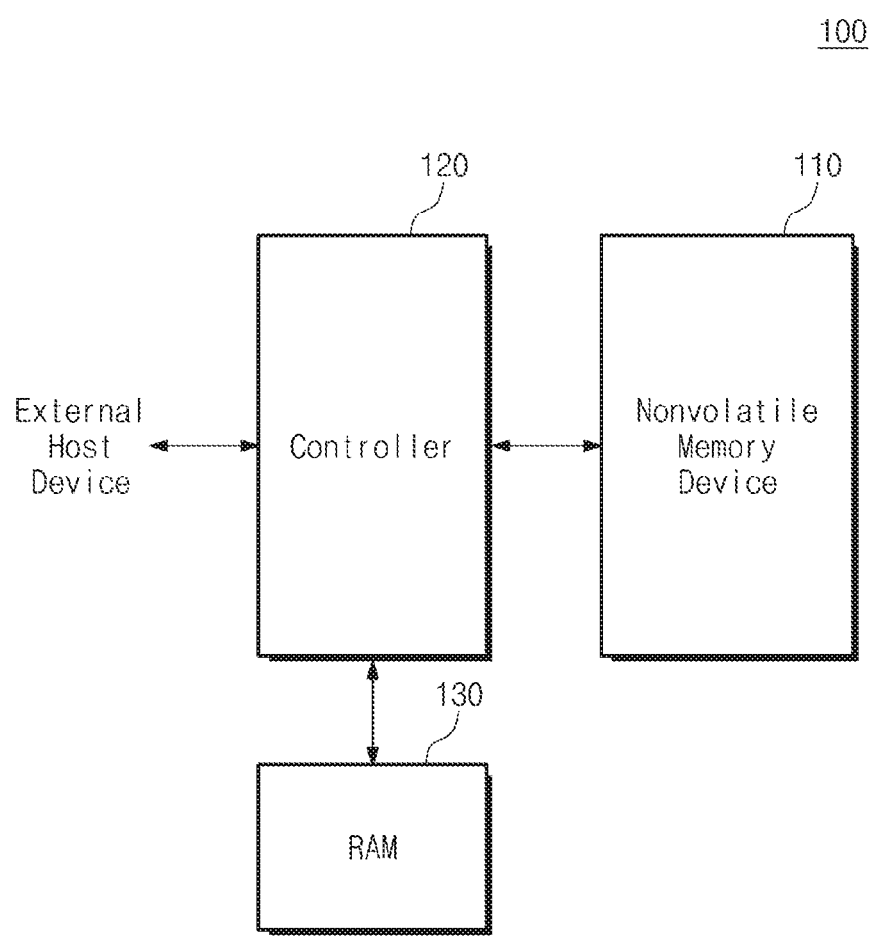
FIG. 16 is a block diagram illustrating a storage device according to example embodiments of inventive concepts.

FIG. 16 is a block diagram illustrating a storage device 100 according to example embodiments of inventive concepts. Referring to FIG. 16, a storage device 100 may include a nonvolatile memory device 110, a controller 120, and a random access memory (RAM) 130.

The nonvolatile memory device 110 may perform a write, read or erase operation under control of the controller 120. The nonvolatile memory device 110 may receive a command and an address from the controller 120 through an input/output channel. The nonvolatile memory device 110 may exchange data with the controller 120 through the input/output channel.

The nonvolatile memory device 110 may include a flash memory. However, the scope and spirit of inventive concepts may not be limited thereto. For example, the nonvolatile memory device 110 may incorporate at least one of nonvolatile memory devices, such as a phase-change RAM (PRAM), a magnetic RAM (MRAM), a resistive RAM (RRAM), and a ferroelectric RAM (FeRAM).

The controller 120 may be a memory controller configured to access the nonvolatile memory device 110. For example, the controller 120 may control the nonvolatile memory device 110 through an input/output channel and a control channel so as to perform a write, read or erase operation.

The controller 120 may control the nonvolatile memory device 110 under control of an external host device (not illustrated). For example, the controller 120 may communicate with the external host device based on the format different from the format for communications with the nonvolatile memory device 110. A unit of data that the controller 120 conveys to the nonvolatile memory device 110 may be different from a unit of data that the controller 120 conveys to the external host device.

The controller 120 may use the RAM 130 as a working memory, a buffer memory, or a cache memory. The controller 120 may store data or codes, needed to manage the nonvolatile memory device 110, at the RAM 130. For example, the controller 120 may read data or codes, needed to manage the nonvolatile memory device 110, from the nonvolatile memory device 110 and may load the read data or codes on the RAM 130 for driving.

The RAM 130 may include at least one of a variety of random access memories, such as, but not limited to, a static RAM (SRAM), a dynamic RAM (DRAM), a synchronous DRAM (SRAM), a PRAM, a MRAM, a RRAM, and a FRAM.

The storage device 100 may include a solid state drive (SSD) or a hard disk drive (HDD). The storage device 100 may include memory cards, such as a PC card (personal computer memory card international association (PCM-CIA)), a compact flash (CF) card, a smart media card (e.g., SM, SMC), a memory stick, a multimedia card (e.g., MMC, RS-MMC, MMCmicro), an SD card (e.g., SD, miniSD, microSD, SDHC), a universal serial bus (USB) memory card, and a universal flash storage (UFS). The storage device 100 may include embedded memories, such as an embedded MultiMedia card (eMMC), a UFS, and a PPN (Perfect Page NAND).

In FIG. 16, an example according to example embodiments of inventive concepts is provided as the RAM 130 is disposed outside the controller 120. However, the scope and spirit of inventive concepts may not be limited thereto. For example, the storage device 100 may not include the RAM 130 disposed outside the controller 120. The controller 120 may use an internal RAM (refer to FIG. 21) as a buffer memory, a working memory, or a cache memory.

As described with reference to FIGS. 1 to 15, when one or more of the driver circuits 13 to 16 described with reference to FIGS. 5 to 8 are applied to the nonvolatile memory device 110, the operating speed of the nonvolatile memory device 110 may be improved, and the complexity and area thereof may be reduced. This may mean that the operating speed of the nonvolatile memory device 110 is improved and the complexity and area thereof are reduced Furthermore, a manufacturing cost of the nonvolatile memory device 110 and the storage device 110 may be reduced.

Figure 17:
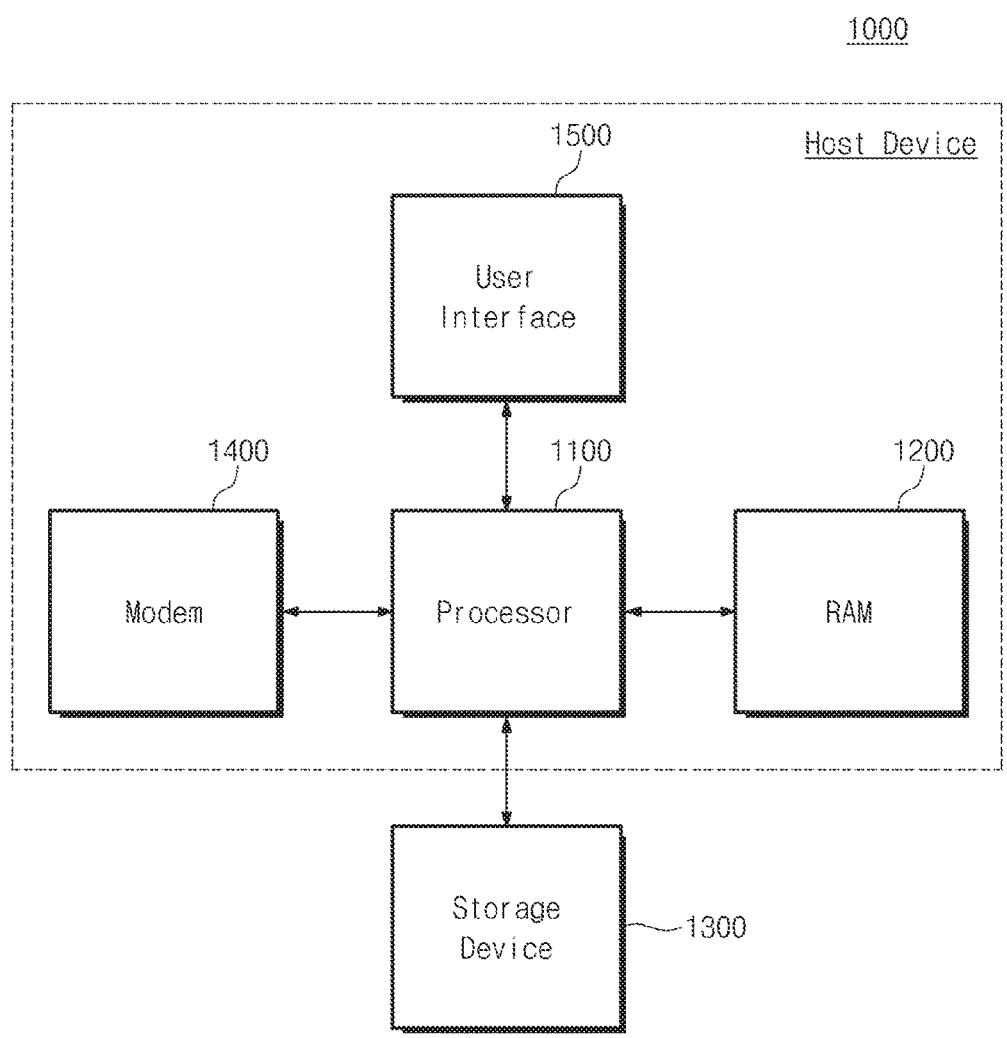
FIG. 17 is a block diagram illustrating a computing device according to example embodiments of inventive concepts.

FIG. 17 is a block diagram illustrating a computing device 1000 according to example embodiments of inventive concepts. Referring to FIG. 17, a computing device 1000 may include a processor 1100, a RAM 1200, a storage device 1300, a modem 1400, and a user interface 1500.

The processor 1100 may control an overall operation of the computing device 100 and may perform a logic operation. The processor 1100 may be a data processing device which is based on hardware including a circuit physically configured to execute operations expressed by commands included in a code or program. For example, the processor 1100 may be a system-on-chip (SoC). The processor 1100 may be a general purpose processor, a specific-purpose processor, or an application processor.

The RAM 1200 may communicate with the processor 1100. The RAM 1200 may be a main memory of the processor 1100 or the computing device 1000. The processor 1100 may store codes or data at the RAM 1200 temporarily. The processor 1100 may execute codes using the RAM 1200 and may process data. The processor 1100 may execute a variety of software, such as an operating system and an application, using the RAM 1200. The processor 1100 may control an overall operation of the computing device 1000 using the RAM 1200. The RAM 1200 may include a volatile memory such as an SRAM, a DRAM, a SDRAM, and the like or a nonvolatile memory such as a PRAM, an MRAM, an RRAM, an FRAM, and the like.

The storage device 1300 may communicate with the processor 1100. The storage device 1300 may be used to store data for a long time. That is, the processor 110 may store data, which is to be stored for a long time, at the storage device 1300. The storage device 1300 may store a boot image for driving the computing device 1000. The storage device 1300 may store source codes of a variety of software, such as an operating system and an application. The storage device 1300 may store data that is processed by a variety of software, such as an operating system and an application.

In example embodiments, the processor 1100 may load source codes stored at the storage device 1300 onto the RAM 1200 and may execute the codes, thereby driving a variety of software, such as operating system, application, and the like. The processor 1100 may load data stored at the storage device 1300 onto the RAM 1200 and may process data loaded on the RAM 1200. The processor 1100 may store long-term data among data, stored at the RAM 1200, at the storage device 1300.

The storage device 1300 may include a nonvolatile memory, such as, but not limited to, a flash memory, a PRAM, an MRAM, an RRAM, or an FRAM.

The modem 1400 may communicate with an external device under control of the processor 1100. For example, the modem 1400 may communicate with the external device in a wired or wireless manner. The modem 1400 may communicate with the external device, based on at least one of wireless communications manners such as long term evolution (LTE), WiMax, global system for mobile communication (GSM), code division multiple access (CDMA), Bluetooth, near field communication (NFC), Wi-Fi, radio frequency identification (RFID), and the like or wired communications manners such as universal serial bus (USB), SATA, HSIC, SCSI, Firewire, peripheral component interconnection (PCI), PCI express (PCIe), nonvolatile memory express (NVMe), universal flash storage (UFS), secure digital (SD), SDIO, universal asynchronous receiver transmitter (UART), serial peripheral interface (SPI), high speed SPI (HS-SPI), RS232, inter-integrated circuit (I2C), HS-I2C, integrated-interchip sound (I2S), Sony/Philips digital interface (S/PDIF), multimedia card (MMC), embedded MMC (eMMC), and so on.

The user interface 1500 may communicate with a user under control of the processor 1100. For example, the user interface 1500 may include user input interfaces such as a keyboard, a keypad, buttons, a touch panel, a touch screen, a touch pad, a touch ball, a camera, a microphone, a gyroscope sensor, and a vibration sensor. The user interface 150 may further include user output interfaces such as a liquid crystal display (LCD), an organic light-emitting diode (OLED) display device, an active matrix OLED (AMO-LED) display device, a light-emitting diode (LED), a speaker, and a motor.

As described with reference to FIGS. 1 to 15, when one or more of the driver circuits 13 to 16 described with reference to FIGS. 5 to 8 are applied to the storage device 1300, the operating speed of the storage device 1300 may be improved, and the complexity and area thereof may be reduced. This may mean that the operating speed of the computing device 1000 is improved and the complexity and area thereof are reduced Furthermore, a manufacturing cost of the storage device 1300 and the computing device 1000 may be reduced.

According to example embodiments of inventive concepts, a driver circuit may be configured to drive a clamp transistor using an amplifier. Thus, a driving capacity of the driver circuit may be improved. Furthermore, the driver circuit may be composed of a single stage amplifier. Thus, the number of transistors constituting the driver circuit may be reduced, and thus the area of the driver circuit may be reduced.

Figure 18:
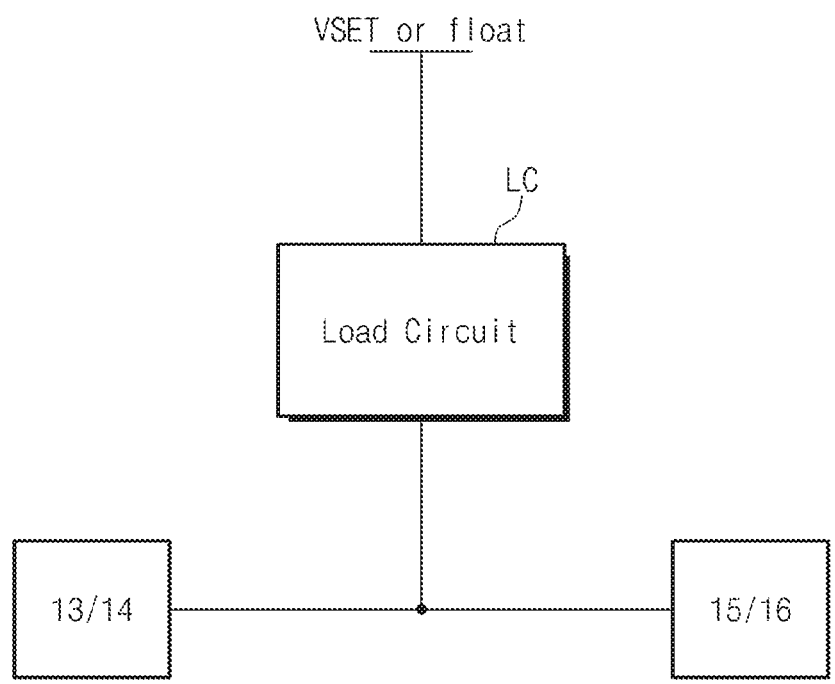
FIG. 18 is a block diagram illustrating an embodiment including a plurality of driver circuits according to example embodiments of inventive concepts.

FIG. 18 is a block diagram illustrating an embodiment including a plurality of driver circuits according to example embodiments of inventive concepts. Referring FIG. 18, a load circuit LC may be connected with the first driver circuit 13 or 14 shown in FIGS. 5 and 6 and the second driver circuit 15 or 16 shown in FIGS. 7 and 8. The load circuit LC may be supplied with a setting voltage VSET directly from an external power source (not shown) as shown in FIGS. 5 and 7 or supplied with the setting voltage VSET from the first and second driver circuits 14 and 16 as shown in FIGS. 6 and 8. When the setting voltage VSET is supplied from the driver circuits 14 and 16, the load circuit LC may be floated from the external power source or also receive the setting voltage VSET from the external power source. The driver circuit 13 or 14 may be used to decrease a voltage of the load circuit LC. The driver circuit 15 or 16 may be used to increase a voltage of the load circuit LC.

As shown in FIG. 18, two or more driver circuits may be connected with a load circuit to drive a voltage of the load circuit. Driver circuits with the same type (e.g., increasing or decreasing type) may enhance driving capacity in parallel. Driver circuits with different types (e.g., increasing and decreasing types) may provide increasing capability and decreasing capability of the voltage of the load circuit. Types and a number of driver circuits connected to the load circuit is not limited.

Even though hardware implementations (e.g., specific circuits) of driver circuits according to example embodiments have been described with reference to FIGS. 3 and 5-8 of the present application, one of ordinary skill in the art would appreciate that a driver module could alternatively implement features of the above-described driver circuits. For example, a driver module may include a driver memory (e.g., memory device) and a controller (e.g., microprocessor) configured to execute computer-readable code (e.g., software) stored in the driver memory, wherein the computer-readable code transforms the controller into a special-purpose controller configured to perform some or all of the operations described herein as being performed by one or more of the driver circuits according to example embodiments in FIGS. 3 and 5-8 of the present application.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. A driver circuit, comprising:
  a clamp switch including a gate configured to receive a clamp voltage, a first node, and a second node connected to a charge node;
  a charge circuit connected to the first node of the clamp switch,
    the charge circuit being at least one of configured to drain a current from the charge node through the clamp switch and configured to supply a current to the charge node through the clamp switch;
  a comparison voltage generator configured to output a comparison voltage;
  a single stage amplifier,
    the single stage amplifier being configured to amplify a difference between the comparison voltage and a voltage of the charge node, and
    the single stage amplifier being configured to output the clamp voltage as the amplification result; and a current bias circuit connected to the gate of the clamp switch,
  the current bias circuit being configured to adjust the amount of current flowing to a ground node to which a ground voltage is supplied through the comparison voltage generator, the single stage amplifier, and the current bias circuit.

2. The driver circuit of claim 1, wherein the single stage amplifier includes:
  a transistor including a gate connected to the charge node, a first node connected to the comparison voltage generator, and
  a second node connected to the gate of the clamp switch.

3. The driver circuit of claim 1, wherein the charge circuit includes:
  a first transistor connected between the first node of the clamp switch and a first voltage node to which a first voltage is supplied,
  the first transistor being configured to activate in response to a discharge enable signal;
  a second transistor connected to the first voltage node,
    the second transistor being configured to activate in response to a charge enable signal; and
  a current source connected between the second transistor and the first node of the clamp switch.

4. The driver circuit of claim 1, wherein the comparison voltage generator includes:
  a transistor including a gate configured to receive a reference voltage, a first comparison voltage node configured to receive a first voltage, and a second comparison voltage node configured to output the comparison voltage.

5. The driver circuit of claim 1, wherein the current bias circuit includes:
  a transistor having a gate configured to receive a bias voltage,
  a first bias node configured to receive a first voltage, and
  a second bias node connected to the gate of the clamp switch.

6. The driver circuit of claim 1, further comprising:
  a voltage generator configured to supply a setting voltage to the charge node in response to a set enable signal.

7. The driver circuit of claim 1, further comprising:
  a second clamp switch including a second gate configured to receive a second clamp voltage, a third node, and a fourth node connected to the charge node;
  a second charge circuit connected to the third node of the second clamp switch,
    the second charge circuit being at least one of configured to drain a current from the charge node through the second clamp switch and configured to supply a current to the charge node through the second clamp switch;
  a second comparison voltage generator configured to output a second comparison voltage;

a second single stage amplifier,
  the second single stage amplifier being configured to amplify a difference between the second comparison voltage and the voltage of the charge node,
  the second single stage amplifier being configured to output the second clamp voltage as the amplification result; and
a second circuit bias circuit connected to the second gate of the second clamp switch,
  the second current bias circuit being configured to adjust the amount of current flowing to a second ground node to which the ground voltage is supplied through the second comparison voltage generator, the second single stage amplifier, and the second current bias circuit.

8. The driver circuit of claim 7, wherein
each of the clamp switch and the single stage amplifier includes a PMOS transistor, and
each of the charge circuit and the bias circuit includes an NMOS transistor.

9. The driver circuit of claim 7, wherein
each of the second clamp switch and the second single stage amplifier includes an NMOS transistor, and
each of the second charge circuit and the second bias circuit includes a PMOS transistor.

10. A driver circuit configured to charge a conductive line connected to a plurality of memory cells of a nonvolatile memory, the driver circuit comprising:
  a clamp switch including a gate configured to receive a clamp voltage, a first node, and a second node connected to a charge node of the conductive line;
  a charge circuit connected to the first node of the clamp switch,
    the charge circuit being at least one of configured to drain a current from the charge node through the clamp switch and configured to supply a current to the charge node through the clamp switch;
  a comparison voltage generator configured to output a comparison voltage;
  a single stage amplifier,
    the single stage amplifier being configured to amplify a difference between the comparison voltage and a voltage of the charge node, and
    the single stage amplifier being configured to output the clamp voltage as the amplification result; and
  a current bias circuit connected to the gate of the clamp switch,
    the current bias circuit being configured to adjust the amount of current flowing to a ground node to which a ground voltage is supplied through the comparison voltage generator, the single stage amplifier, and the current bias circuit.

* * * * *